United States Patent
Adachi et al.

(10) Patent No.: US 11,283,305 B2
(45) Date of Patent: Mar. 22, 2022

(54) ELECTRONIC APPARATUS AND WIRELESS POWER TRANSMISSION METHOD

(71) Applicant: KABUSHIKI KAISHA TOSHIBA, Tokyo (JP)

(72) Inventors: Tomoko Adachi, Kanagawa (JP); Toshiya Mitomo, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 46 days.

(21) Appl. No.: 16/297,325

(22) Filed: Mar. 8, 2019

(65) Prior Publication Data
US 2020/0052530 A1     Feb. 13, 2020

(30) Foreign Application Priority Data
Aug. 7, 2018    (JP) .............................. JP2018-148542

(51) Int. Cl.
| H01F 27/42 | (2006.01) |
| H01F 37/00 | (2006.01) |
| H01F 38/00 | (2006.01) |
| H02J 50/80 | (2016.01) |
| H03G 3/30  | (2006.01) |
| H04B 1/04  | (2006.01) |

(52) U.S. Cl.
CPC ........... *H02J 50/80* (2016.02); *H03G 3/3042* (2013.01); *H04B 2001/0416* (2013.01)

(58) Field of Classification Search
CPC . H02J 5/005; H02J 7/025; H02J 17/00; H01F 38/14; B60L 11/182
USPC ........................................................ 307/104
See application file for complete search history.

(56) References Cited

U.S. PATENT DOCUMENTS

| 9,203,464 B2 * | 12/2015 | Kim ..................... H04W 72/085 |
| 2004/0240573 A1 * | 12/2004 | Yuasa .................. H04B 1/0032 375/260 |
| 2009/0247199 A1 | 10/2009 | Oodachi et al. |
| 2013/0154387 A1 * | 6/2013 | Lee ......................... H02J 50/80 307/104 |
| 2013/0252553 A1 * | 9/2013 | Hyon .................... H04W 16/14 455/41.2 |
| 2014/0341052 A1 * | 11/2014 | Devarasetty .......... H04W 24/08 370/252 |
| 2015/0303741 A1 | 10/2015 | Malik et al. |

(Continued)

FOREIGN PATENT DOCUMENTS

| JP | 2001285301 A | 10/2001 |
| JP | 2007274538 A | 10/2007 |

(Continued)

OTHER PUBLICATIONS

Robert Stacey, "IEEE P802.11—Wireless LANs—Specification Framework for TGax," doc.: IEEE 802.11-15/0132r15, May 25, 2016, pp. 1-61.

*Primary Examiner* — Quan Tra
(74) *Attorney, Agent, or Firm* — Holtz, Holtz & Volek PC

(57) ABSTRACT

According to one embodiment, an electronic apparatus includes a control circuitry and a transmitter. The control circuitry is configured to select a first frequency band based on channel information on at least one communication channel included in a communication frequency band of a wireless communication standard. The transmitter transmits power via an electromagnetic wave in the first frequency band.

17 Claims, 13 Drawing Sheets

(56) References Cited

U.S. PATENT DOCUMENTS

| | | | |
|---|---|---|---|
| 2016/0234420 A1* | 8/2016 | Lee | H04N 7/185 |
| 2016/0262067 A1* | 9/2016 | Hara | H04W 36/30 |
| 2017/0011238 A1 | 1/2017 | Robl et al. | |
| 2017/0251481 A1 | 8/2017 | Nakayama et al. | |
| 2018/0269925 A1* | 9/2018 | Matsuo | H02J 7/025 |
| 2019/0341811 A1* | 11/2019 | Elliott | H02J 7/025 |

FOREIGN PATENT DOCUMENTS

| | | |
|---|---|---|
| JP | 2008148215 A | 6/2008 |
| JP | 2009239640 A | 10/2009 |
| JP | 2013102642 A | 5/2013 |
| JP | 2017055596 A | 3/2017 |
| JP | 2017507598 A | 3/2017 |
| JP | 2017152953 A | 8/2017 |
| WO | 2012111155 A1 | 8/2012 |

\* cited by examiner

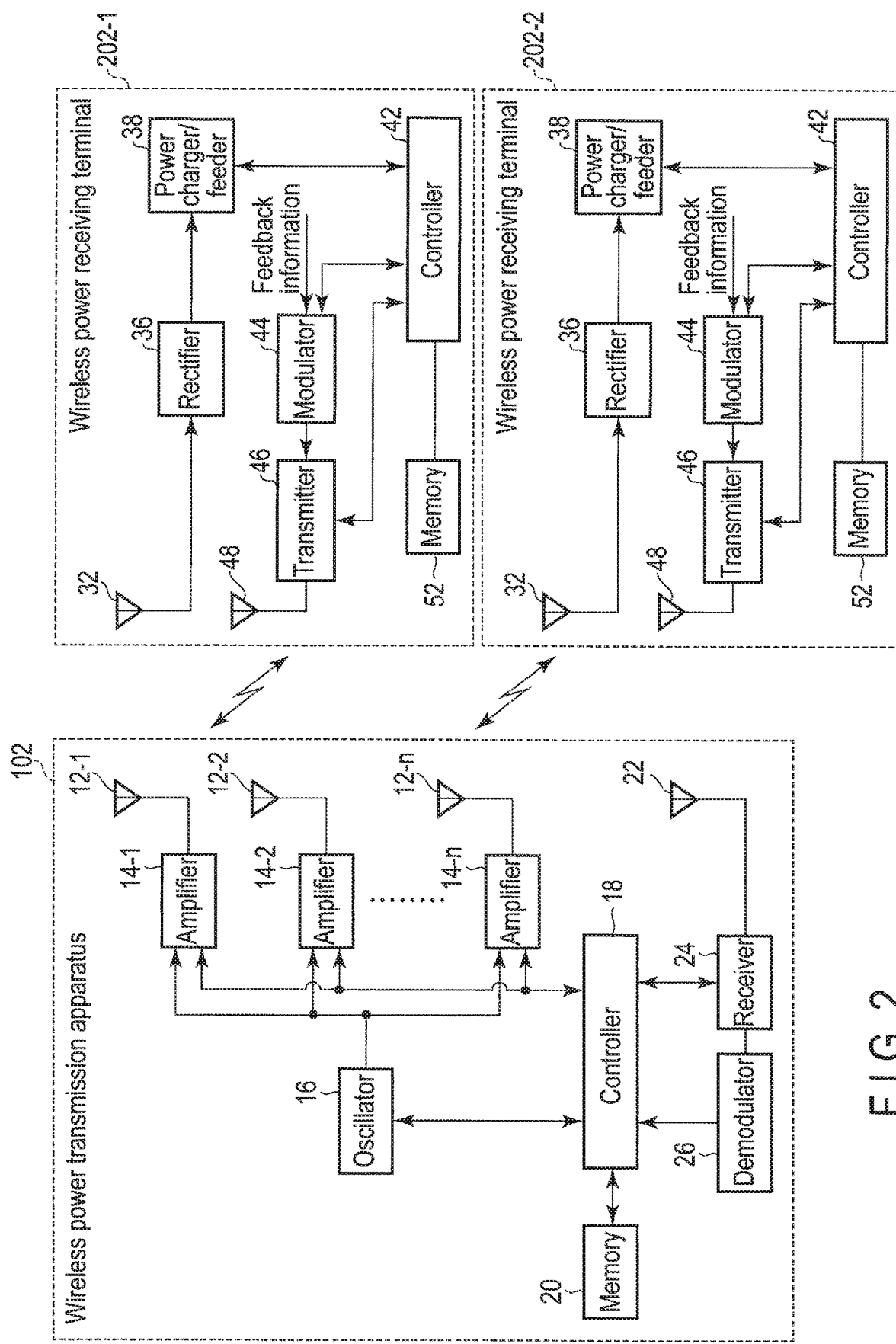
F I G. 2

| Channel width | Channel number | Center frequency |
|---|---|---|
| 20MHz | 100 | 5,500MHz |
| | 104 | 5,520MHz |
| | 108 | 5,540MHz |
| | 112 | 5,560MHz |
| | 116 | 5,580MHz |
| | 120 | 5,600MHz |
| | 124 | 5,620MHz |
| | 128 | 5,640MHz |
| | 132 | 5,660MHz |
| | 136 | 5,680MHz |
| | 140 | 5,700MHz |
| 40MHz | 102 | 5,510MHz |
| | 110 | 5,550MHz |
| | 118 | 5,590MHz |
| | 126 | 5,630MHz |
| | 134 | 5,670MHz |
| 80MHz | 106 | 5,530MHz |
| | 122 | 5,610MHz |
| 160MHz | 114 | 5,570MHz |

| Channel width | Channel number | Center frequency |
|---|---|---|
| 20MHz | 100 | 5,500MHz |
| | 104 | 5,520MHz |
| | 108 | 5,540MHz |
| | 112 | 5,560MHz |
| | 116 | 5,580MHz |
| | 120 | 5,600MHz |
| | 124 | 5,620MHz |
| | 128 | 5,640MHz |
| | 132 | 5,660MHz |
| | 136 | 5,680MHz |
| | 140 | 5,700MHz |
| | 144 | 5,720MHz |
| 40MHz | 102 | 5,510MHz |
| | 110 | 5,550MHz |
| | 118 | 5,590MHz |
| | 126 | 5,630MHz |
| | 134 | 5,670MHz |
| | 142 | 5,710MHz |
| 80MHz | 106 | 5,530MHz |
| | 122 | 5,610MHz |
| | 138 | 5,690MHz |
| 160MHz | 114 | 5,570MHz |

| Channel width | Frequency band | Channel number | Center frequency |
|---|---|---|---|
| 20MHz | W52 | 36 | 5,180MHz |
| | | 40 | 5,200MHz |
| | | 44 | 5,220MHz |
| | | 48 | 5,240MHz |
| | W53 | 52 | 5,260MHz |
| | | 56 | 5,280MHz |
| | | 60 | 5,300MHz |
| | | 64 | 5,320MHz |
| 40MHz | W52 | 38 | 5,190MHz |
| | | 46 | 5,230MHz |
| | W53 | 54 | 5,270MHz |
| | | 62 | 5,310MHz |
| 80MHz | W52 | 42 | 5,210MHz |
| | W53 | 58 | 5,290MHz |
| 160MHz | W52+W53 | 50 | 5,250MHz |

| Channel width | RU size | Pilot subcarrier indices (802.11ax) (Position of center frequency is zero with bilaterally symmetric arrangement) |
|---|---|---|
| 20MHz | 26, 52 | ±10, ±22, ±36, ±48, ±62, ±76, ±90, ±102, ±116 |
| | 106, 242 | ±22, ±48, ±90, ±116 |
| 40MHz | 26, 52 | ±10, ±22, ±36, ±50, ±64, ±78, ±90, ±104, ±116, ±130, ±144, ±158, ±170, ±184, ±198, ±212, ±224, ±238 |
| | 106, 242, 484 | ±10, ±36, ±78, ±104, ±144, ±170, ±212, ±238 |
| 80MHz | 26, 52 | ±10, ±24, ±38, ±50, ±64, ±78, ±92, ±104, ±118, ±130, ±144, ±158, ±172, ±184, ±198, ±212, ±226, ±238, ±252, ±266, ±280, ±292, ±306, ±320, ±334, ±346, ±360, ±372, ±386, ±400, ±414, ±426, ±440, ±454, ±468, ±480, ±494 |
| | 106, 242, 484 | ±24, ±50, ±92, ±118, ±158, ±184, ±226, ±252, ±266, ±292, ±334, ±360, ±400, ±426, ±468, ±494 |
| | 996 | ±24, ±92, ±158, ±226, ±266, ±334, ±400, ±468 |
| 160MHz | 26, 52, 106, 242, 484 | Pilot subcarrier indices in 80 MHz - 512, pilot subcarrier indices in 80 MHz + 512 |
| | 996 | For the lower 80 MHz, pilot subcarrier indices in 80 MHz - 512, for the upper 80 MHz, pilot subcarrier indices in 80 MHz + 512 |

FIG. 9

| Channel width | Pilot subcarrier indices (802.11a) |
|---|---|
| 20MHz | ±21, ±7 |

| Channel width | Pilot subcarrier indices (802.11n) |
|---|---|
| 20MHz | ±21, ±7 |
| 40MHz | ±53, ±25, ±11 |

| Channel width | Pilot subcarrier indices (802.11ac) |
|---|---|
| 20MHz | ±21, ±7 |
| 40MHz | ±53, ±25, ±11 |
| 80MHz | ±103, ±75, ±39, ±11 |
| 160MHz | ±231, ±203, ±167, ±139, ±117, ±89, ±53, ±25 |

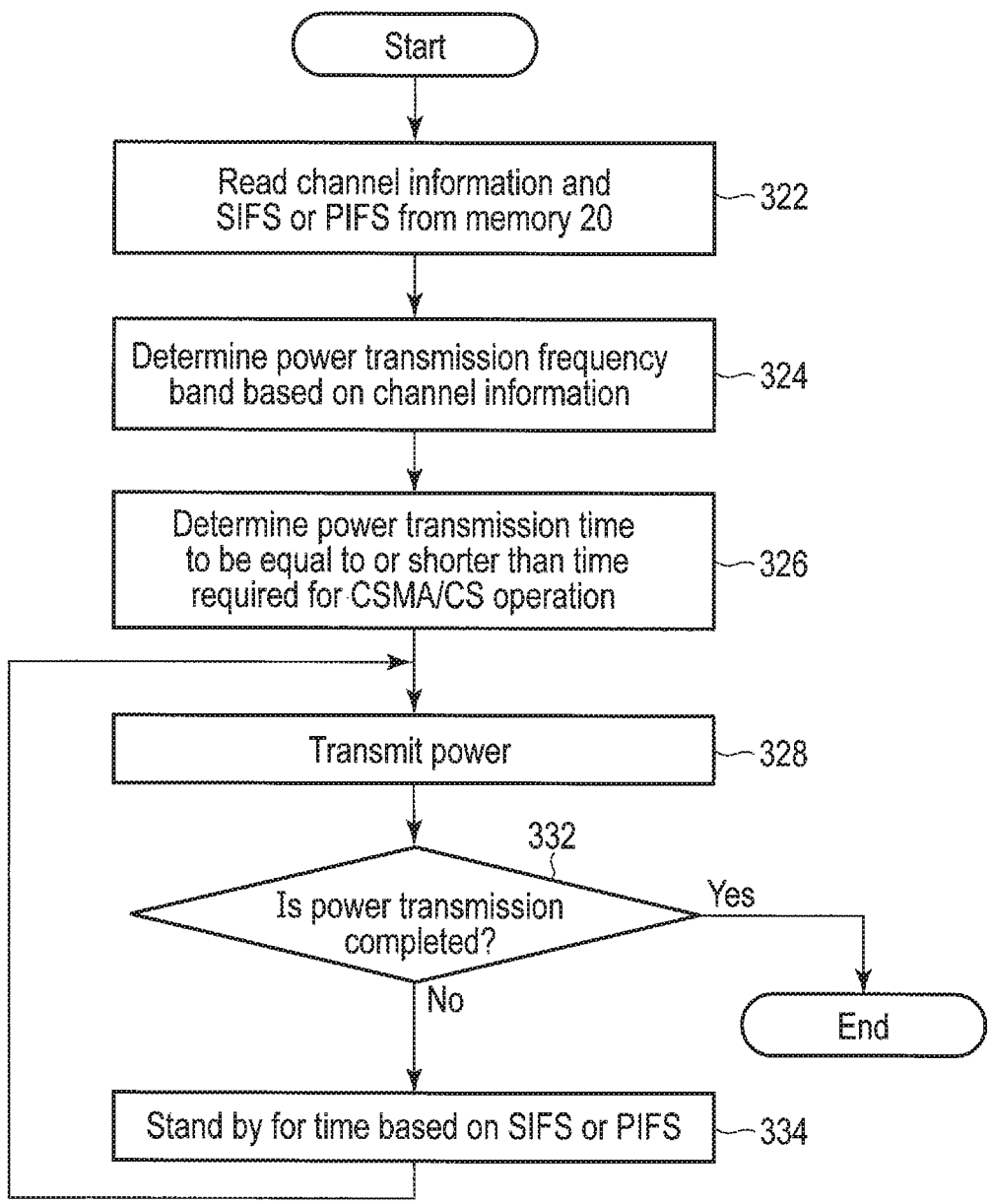
F I G. 17

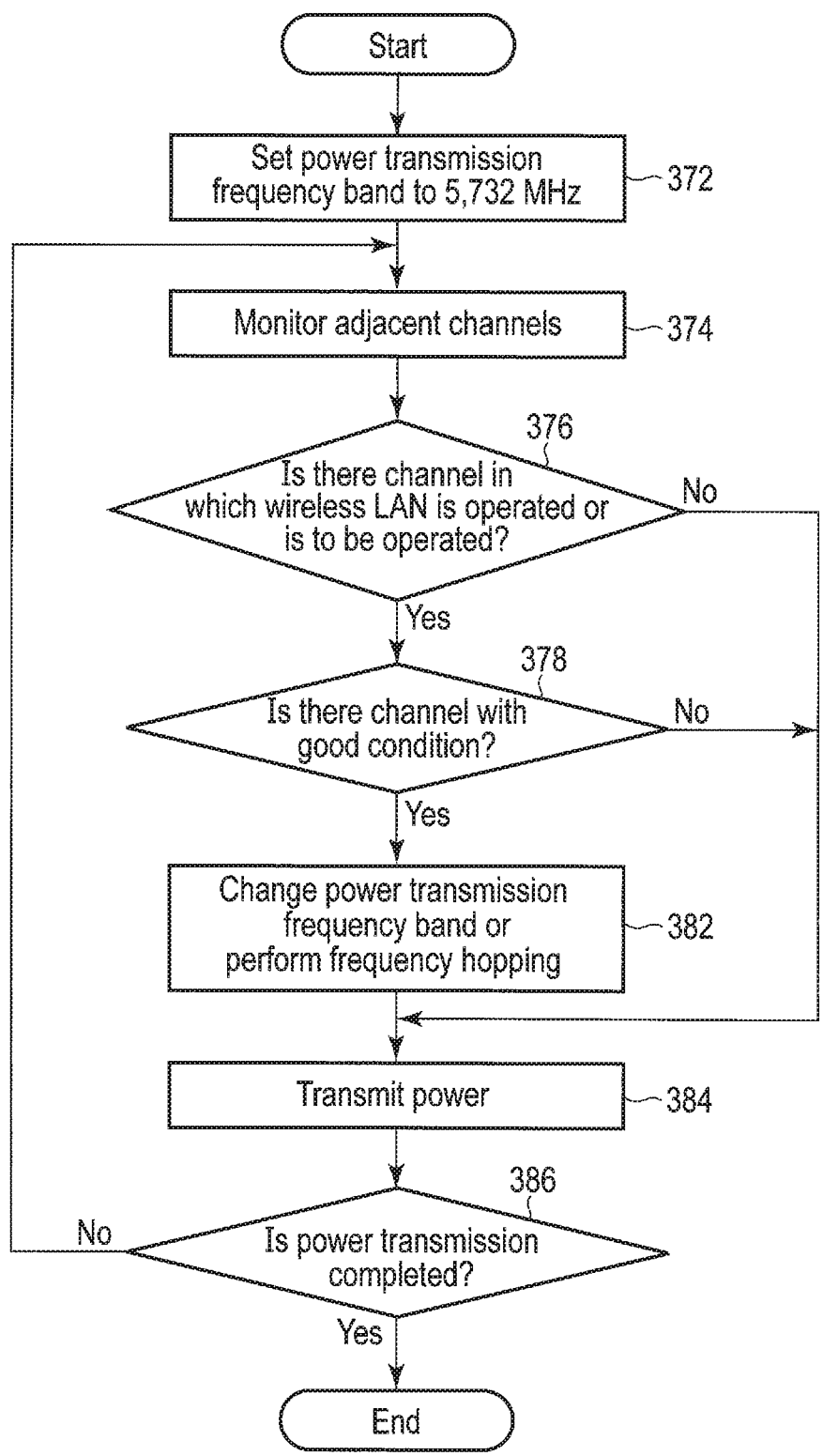
F I G. 19

US 11,283,305 B2

ELECTRONIC APPARATUS AND WIRELESS POWER TRANSMISSION METHOD

CROSS-REFERENCE TO RELATED APPLICATIONS

This application is based upon and claims the benefit of priority from Japanese Patent Application No. 2018-148542, filed Aug. 7, 2018, the entire contents of which are incorporated herein by reference.

FIELD

Embodiments described herein relate generally to wireless power transmission.

BACKGROUND

There is a demand for a wireless power transmission apparatus that transmits electric power using radio waves to be able to coexist with a wireless system operating within a power transmission region that is a range in which power can be transmitted. A coexistence method is a method for causing the wireless power transmission apparatus not to interfere with or hardly interfere with the wireless system.

As an example of such a wireless power transmission apparatus, there is a contactless charger that wirelessly transmits charging radio waves to charge a portable electronic device. As one of methods for making it difficult for charging radio waves transmitted from the contactless charger to interfere with communication of an in-vehicle wireless system, there is a method of sweeping frequencies of the charging radio wave to detect a frequency of the in-vehicle system and hopping a power transmission frequency with respect to the portable electronic device while avoiding the detected frequency.

The conventional wireless power transmission apparatus is premised on detection of a frequency of a wireless system operating in the power transmission region. Time for such detection leads to deterioration in efficiency of a power transmission operation.

BRIEF DESCRIPTION OF THE DRAWINGS

FIG. 2 is a block diagram illustrating another example of the wireless power feeding system including another example of the wireless power transmission apparatus according to the first embodiment.

FIG. 9 is a view listing positions of pilot subcarriers in a wireless LAN of the IEEE802.11ax standard for each channel width.

FIG. 17 is a flowchart illustrating another example of the power transmission control according to the third embodiment.

FIG. 19 is a flowchart illustrating an example of power transmission control according to a fifth embodiment.

DETAILED DESCRIPTION

Figure 1:
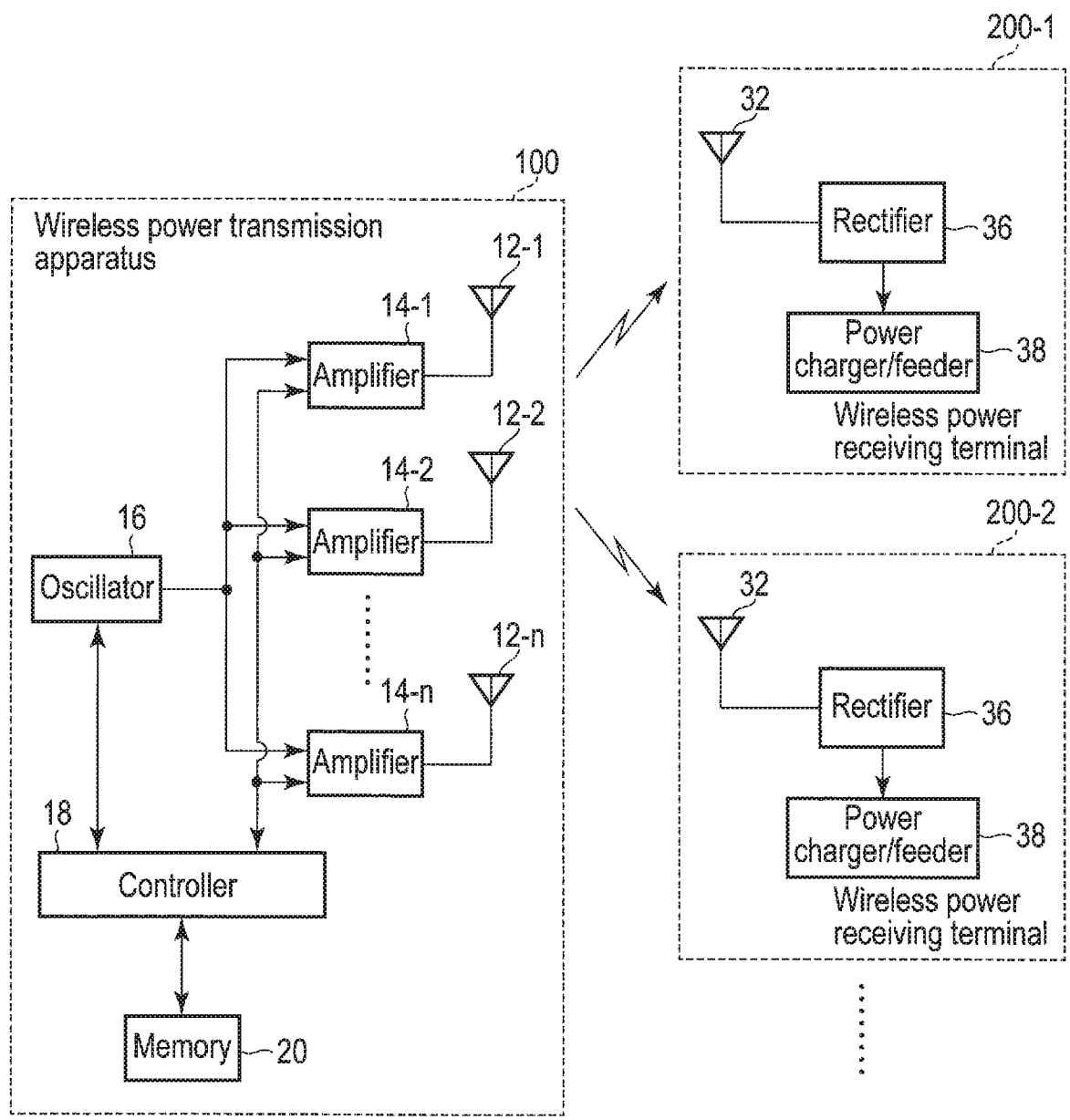
FIG. 1 is a block diagram illustrating an example of a wireless power feeding system including an example of a wireless power transmission apparatus according to a first embodiment.

Various embodiments will be described hereinafter with reference to the accompanying drawings. The disclosure is merely an example, and the invention is not limited by the contents described in the following embodiments. It is a matter of course that modifications easily conceivable by those skilled in the art are included in the scope of the disclosure. A size, a shape, and the like of each part are sometimes changed from those of an actual embodiment and schematically represented in the drawings in order to further clarify the description. In the drawings, corresponding elements are denoted by the same reference numerals, and a detailed description thereof is omitted in some cases.

In general, according to one embodiment, an electronic apparatus includes a control circuitry and a transmitter. The control circuitry is configured to select a first frequency band to transmit power via an electromagnetic wave based on channel information on at least one communication channel included in a communication frequency band of a wireless communication standard. The transmitter transmits power via an electromagnetic wave in the first frequency band.

[Overall Configuration of Wireless Power Feeding System]

FIG. 1 is a block diagram illustrating an example of a wireless power feeding system including a wireless power transmission apparatus as an electronic apparatus according to a first embodiment. The wireless power feeding system includes one or a plurality of wireless power transmission apparatuses 100 and one or a plurality of wireless power receiving terminals 200. FIG. 1 illustrates an example of a system including a single wireless power transmission apparatus 100 and a plurality of wireless power receiving terminals 200-1, 200-2, . . . (sometimes collectively referred to as a wireless power receiving terminal 200). The wireless power transmission apparatus 100 can transmit power to the wireless power receiving terminal 200 positioned in a power transmission region.

The wireless power transmission apparatus 100 transmits power to the one or more wireless power receiving terminals 200 via electromagnetic waves of a particular frequency band (hereinafter referred to as a power transmission frequency band). The wireless power transmission apparatus 100 includes an oscillator 16, amplifiers 14-1, 14-2, . . . 14-$n$, which amplify a radio-frequency signal (RF signals) output from the oscillator 16 and supply the amplified RF signals to transmission antennas 12-1, 12-2, . . . 12-$n$, a control circuitry (hereinafter called controller) 18 which controls the oscillator 16 and the amplifiers 14-1, 14-2, . . . 14-$n$, and a memory 20. The RF signal amplified by the amplifiers 14-1, 14-2, . . . 14-$n$ are supplied to the transmission antennas 12-1, 12-2, . . . 12-$n$, and the electromagnetic wave is radiated from the transmission antennas 12-1, 12-2, . . . 12-$n$. Power is transmitted from the wireless power transmission apparatus 100 to the wireless power receiving terminal 200 using this electromagnetic wave.

When a wireless communication system (for example, a wireless LAN, dedicated short range communication (DSRC), or the like) exists within the power transmission region of the wireless power transmission apparatus 100, the electromagnetic wave used for power transmission is likely to interfere with the wireless communication system. There is a demand for the wireless power transmission apparatus 100 to coexist with the wireless communication system operating within the power transmission region. That is, it is necessary for the wireless power transmission apparatus 100 to control the power transmission such that the interference does not occur or the interference hardly occurs. Thus, control information to control power transmission is input to the controller 18. The control information may be input to the controller 18 through an input unit. The input unit may be a keyboard or the like by which a user inputs the control information, may be a receiver that receives the control information transmitted from another device, or may be the memory 20 in which the control information has been stored in advance. In addition, control information input from a keyboard or a receiver may be stored in the memory 20. An example of the control information includes information on at least one communication channel (hereinafter referred to as channel information) included in a communication frequency band of the wireless communication system that is likely to exist within the power transmission region. In addition, the control information may include information on (i) a frequency band in which the wireless power transmission apparatus 100 can operate, and (ii) information indicating a power transmission condition such as a center frequency (hereinafter referred to as a power transmission frequency) of the channel that actually transmits power.

The controller 18 accesses, for example, the memory 20 or the like to read these control information, and controls the oscillator 16 and the amplifiers 14-1, 14-2, . . . 14-$n$ based on these control information to control power transmission. For example, the controller 18 may control the oscillator 16 to control the power transmission frequency band, an output time, and the like. The controller 18 may control a gain of the amplifiers 14-1, 14-2, . . . 14-$n$ to control output power (corresponding to transmission power) of the electromagnetic wave. Further, the controller 18 may be configured to control the gain of each of the plurality of amplifiers 14-1, 14-2, . . . 14-$n$ and to control each beam direction of the electromagnetic wave transmitted from the plurality of transmission antennas 12-1, 12-2, . . . 12-$n$ so that it is possible to transmit power to the plurality of wireless power receiving terminals 200 at the same time.

The memory 20 may be incorporated in the controller 18 instead of being provided outside the controller 18. The memory 20 may be a nonvolatile memory. When a power of the wireless power transmission apparatus 100 is constantly turned on and a backup battery is provided, the memory 20 may be a volatile memory. Further, the memory 20 may be a ROM as long as the memory 20 just stores the channel information of the wireless communication system that is likely to exist within the power transmission region of the wireless power transmission apparatus 100.

Each of the wireless power receiving terminals 200-1, 200-2, . . . includes a reception antenna 32, a rectifier 36, and a power charger/feeder 38. The electromagnetic wave received by the reception antenna 32 is converted into DC power by the rectifier 36 and supplied to the power charger/feeder 38. An example of the wireless power receiving terminal 200 may be a portable electronic device such as a smart phone, may be a wearable terminal, or may be a moving object such as an electric vehicle or a drone. Another example of the wireless power receiving terminal 200 may be a sensor for an industrial device installed in a certain space. When the wireless power receiving terminal 200 includes a secondary battery, the power charger/feeder 38 may charge the secondary battery. When the wireless power receiving terminal 200 does not include a secondary battery, the power charger/feeder 38 may directly supply an output of the rectifier 36 to a load of the wireless power receiving terminal 200.

As the power transmission frequency band, for example, a microwave band is used. The microwave band is a frequency band of 300 MHz to 3 THz (with a wavelength of 0.1 mm to 1 m) in a broad sense, and of 3 to 30 GHz (with a wavelength of 1 to 10 cm) in a narrow sense. In the present embodiment, for example, a frequency band at least partially overlapping with a 2.4 GHz band or a 5 GHz band used by the wireless LAN is used as the power transmission frequency band. Thus, the wireless power transmission apparatus 100 of the present embodiment is also referred to as a microwave power transmission apparatus.

For example, transmission power of the wireless power transmission apparatus 100 is 10 W at the maximum, and e.i.r.p (equivalent isotropic radiated power) is 1 kW, its power transmission microwave is a continuous wave, and a bandwidth of its transmission microwave is less than 100 kHz. In this manner, there is a possibility that the power transmission microwave interferes with the communication of the wireless LAN operating within the power transmission region. The controller 18 controls power transmission so as not to cause the interference or so as to reduce the interference such that there is no serious effect on the communication.

Another example of the wireless power transmission apparatus 100 according to the first embodiment will be described. Although the wireless power transmission apparatus 100 illustrated in FIG. 1 controls power transmission by the power transmission apparatus alone, a wireless power transmission apparatus 102 illustrated in FIG. 2 controls power transmission based on feedback information transmitted from wireless power receiving terminals 202-1, 202-2, . . . (sometimes collectively referred to as a wireless power receiving terminal 202). The wireless power transmission apparatus 102 includes a reception antenna 22, a receiver 24, and a demodulator 26 in addition to the oscillator 16, the amplifiers 14-1, 14-2, ..., the transmission antennas 12-1, 12-2, ..., and the controller 18. An output, of the receiver 24 is supplied to the demodulator 26, and an output of the demodulator 26 is supplied to the controller 18.

Each of the wireless power receiving terminals 202-1, 202-2, ... includes a modulator 44, a transmitter 46, a transmission antenna 48, and a controller 42 in addition to the reception antenna 32, the rectifier 36, and the power charger/feeder 38. The feedback information transmitted from the wireless power receiving terminal 202 to the wireless power transmission apparatus 102 is input to the modulator 44, modulated by the modulator 44, and then, transmitted from the transmission antenna 48 by the transmitter 46. The controller 42 controls the respective units included in the wireless power receiving terminal 202. A memory 52 similar to the memory 20 in the power transmission apparatus 102 is also connected to the controller 42. The memory 52 may be incorporated in the controller 42 instead of being provided outside the controller 42. The memory 52 may be a nonvolatile memory or a ROM.

The feedback information transmitted from the wireless power receiving terminal 202 is received by the reception antenna 22 of the wireless power transmission apparatus 102. An output of the receiver 24 is demodulated by the demodulator 26, and the feedback information is input to the controller 18. The feedback information may be stored in the memory 20. For example, the controller 18 controls power transmission based on the control information and the feedback information stored in the memory 20.

An example of the feedback information is information indicating which percentage of charging has been completed when the wireless power receiving terminal 202 charges the secondary battery, information for estimation of a position of the wireless power receiving terminal 202, or the like. Another example of the feedback information is information indicating a state of the wireless channel observed by the wireless power receiving terminal 202. A signal to transmit the feedback information is sometimes referred to as a beacon signal.

As illustrated in FIG. 2, when the wireless power transmission apparatus 102 transmits power to the wireless power receiving terminal 202 and receives the beacon signal from the wireless power receiving terminal 202, the power transmission and the beacon signal reception may be performed by a time division duplex (TDD). In a time division duplex system, the wireless power transmission apparatus 102 can easily perform the power transmission and the power reception even if the power transmission frequency band and a frequency band of the beacon signal for transmission of the feedback information are the same. The power transmission frequency band does not need to be the same as the frequency band of the beacon signal, but may be a different frequency band as will be described below. That is, the time division duplex system is not indispensable.

When the power transmission frequency band and the frequency band of the beacon signal are not the same, the power transmission and the beacon signal reception may be performed by a frequency division duplex (FDD). In a frequency division duplex system, the wireless power transmission apparatus 102 can perform the power transmission and the beacon signal reception at the same time. Further, it is also possible to adopt a system of duplexing (dividing) even the frequency while performing time division of the power transmission and the beacon signal reception. Further, a full duplex (FD) system in which the power transmission and the beacon signal reception can be performed in the same frequency hand and there is no restriction for timing may be adopted.

The transmission of the beacon signal from the wireless power receiving terminal 202 to the wireless power transmission apparatus 102 may be performed using an existing wireless communication system, for example, a wireless personal area network (PAN) such as Bluetooth (registered trademark), Bluetooth Low Energy (BLE) (registered trademark), a cellular communication system such as long term evolution (LTE), or the like. In the present embodiment, the existing wireless communication system is used for the transmission of the beacon signal, and the beacon signal is transmitted in the same frequency band as a frequency band used in the existing wireless communication system. However, while using the existing wireless communication system for transmission of the beacon signal, only its frequency band can be changed from the frequency band of the existing wireless communication system.

For example, when the BLE system is used for the beacon signal transmission, although the ordinary frequency band of the BLE system is the 2.4 GHz band, in the present embodiment, a frequency band on one frequency (for example, 5,732 MHz) in the 5 GHz band different from the 2.4 GHz band may be used for the beacon signal transmission. A standard frequency (referred to as a reference frequency) may be set to the power transmission frequency of the wireless power transmission apparatus, and 5,732 MHz is an example of the reference frequency of the wireless power feeding system. The reference frequency is not limited to 5,732 MHz, and a different frequency may be used.

In addition, a wireless LAN of the IEEE802.11 standard may be used for the beacon signal transmission, instead of the BLE system. In this case, there may be wireless LAN of the IEEE802.11a/n/ac/ax standards as the wireless communication system of the 5 GHz band that is likely to exist within the power transmission region, and thus, it is necessary to determine a transmission frequency band of the beacon signal in consideration of coexistence with the wireless LAN. Thus, channel information of at least one channel operable by the wireless communication system that is likely to exist within the power transmission region is stored in the memory 52 connected to the controller 42 of the wireless power receiving terminal 202. Since the channel information of the wireless communication system that is likely to exist within the power transmission region is stored in the memory 20 in the wireless power transmission apparatus 100 or 102, the wireless power transmission apparatus 100 or 102 may inform the wireless power receiving terminal 202 of this channel information. When wireless communication is used as a method for informing the wireless power receiving terminal 202 of this channel information, the wireless power transmission apparatus 100 or 102 is provided with a modulator and a transmitter similarly to the wireless power receiving terminal 202. When the reception antenna 22, the receiver 24, and the demodulator 26 of the wireless power transmission apparatus 102 are adapted to the wireless LAN of the IEEE802.11 standard operating within the power transmission region, it is possible to efficiently configure the wireless power transmission apparatus 102.

At least a part of the power transmission frequency band in which the wireless power transmission apparatus 100 or 102 can operate overlaps with the communication frequency band of the wireless communication system that is likely to exist within the power transmission region of the wireless power transmission apparatus 100 or 102. This is because a usage situation of the frequency is tight so that the wireless power transmission apparatus 100 or 102 and the wireless system share the frequency band. For example, when the wireless power transmission apparatus 100 or 102 uses a part or the whole of the 5 GHz band, for example, 5,490 MHz to 5,710 MHz, which is a so-called 5.6 GHz band (also denoted by W56) as the power transmission frequency band, the wireless LAN of the IEEE802.11a/n/ac/ax standards (IEEE802.11ax standard is currently being developed. Further, one that will be developed in the future as a wireless LAN standard available in the relevant frequency band is also included in addition to the described standard names) can be used in this frequency band. Therefore, when the power transmission frequency band of the wireless power transmission apparatus 100 or 102 is the 5 GHz band, there is a possibility that the communication of a wireless LAN terminal in the communication frequency band overlapping with the power transmission frequency band or in the vicinity of the power transmission frequency band receives interference with the power transmission microwave if the wireless LAN terminal (including a base station) of the IEEE802.11a/n/ac/ax standards exists in the vicinity of the wireless power transmission apparatus 100 or 120 and/or the wireless power receiving terminal 200 or 202.

In the wireless LAN, sensitivity suppression levels of an adjacent channel and a next adjacent channel of an operation channel have been set, and communication is not hindered as long as the levels are satisfied. However, when transmission power of the wireless power transmission apparatus 100 or 102 is high, there is a risk that a high-frequency part (analog section) of a reception circuit of the wireless LAN is saturated even if power is transmitted in a region of the adjacent channel or the next adjacent channel of the operation channel of the wireless LAN. For example, when the wireless power transmission apparatus 100 or 102 uses 5,732 MHz, which is not included in W56, as the power transmission frequency band, there is a possibility of interfering with the communication of the wireless communication system operating at W56. Thus, it is necessary for the wireless power transmission apparatus 100 or 102 to control power transmission such that the power transmission microwave does not interfere or hardly interferes with the communication of the wireless communication system (here, the wireless LAN system) operating within the power transmission region of the wireless power transmission apparatus 100 or 102. Examples of the power transmission control include adjusting a power transmission frequency band, adjusting a power transmission time, adjusting transmission power, and the like.

[Channel Allocation]

Figures 3, 4:
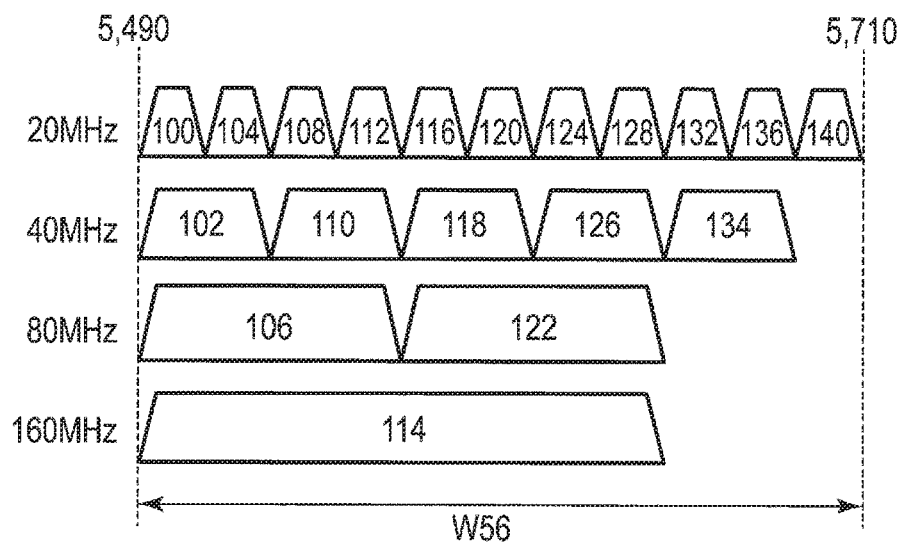
FIG. 3 is a view illustrating an example of channel allocation of a wireless LAN of the IEEE802.11 standard in the case of being operated at 5,490 MHz to 5,710 MHz.
FIG. 4 is a view listing a center frequency of each channel of the wireless LAN of the IEEE802.11 standard to which the channels have been allocated as illustrated in FIG. 3.

First, selection of the power transmission frequency band will be described. For example, allocation of a communication channel of the wireless LAN of the IEEE802.11 standard in the case of being operated in the 5.6 GHz band of 5,490 MHz to 5,710 MHz is performed as illustrated in FIG. 3.

When a channel width is 20 MHz eleven communication channels with channel numbers 100, 104, 108, 112, 116, 120, 124, 128, 132, 136, and 140 are allocated to W56. When a channel width is 40 MHz, five communication channels with channel numbers 102, 110, 118, 126, and 134 are allocated to W56. When a channel width is 80 MHz, two communication channels with channel numbers 106 and 122 are allocated to W56. When a channel width is 160 MHz, one communication channel with a channel number 114 is allocated to W56. In the wireless LAN of the IEEE802.11 standard, plural channel widths can be used, and a channel width of a power of two (two times, four times, and eight times) of 20 MHz, which is a basic channel width, is used. This mode in which plural basic channel widths are used in conjunction is referred to as channel bonding.

Channel information representing plural channel widths and channel positions (center frequencies of communication channels) is stored in the memory 20 of the wireless power transmission apparatus 100 or 102. That is, center frequencies of 5,500 MHz, 5,520 MHz, 5,540 MHz, 5,560 MHz, 5,580 MHz, 5,600 MHz, 5,620 MHz, 5,640 MHz, 5,660 MHz, 5,680 MHz, and 5,700 MHz of the eleven communication channels with the channel numbers 100, 104, 108, 112, 116, 120, 124, 128, 132, 136, and 140 having the channel width of 20 MHz are stored in the memory 20 as shown in FIG. 4. Center frequencies of 5,510 MHz, 5,550 MHz, 5,590 MHz, 5,630 MHz, and 5,670 MHz of five communication channels with the channel numbers 102, 110, 118, 126, and 134 having the channel width of 40 MHz are also stored in the memory 20. Center frequencies 5,530 MHz and 5,610 MHz of two communication channels with the channel numbers 106 and 122 having the channel width of 80 MHz are also stored the memory 20. Center frequency 5,570 MHz of one communication channel with the channel number 114 having the channel width of 160 MHz is also stored in the memory 20.

Figures 5, 6:
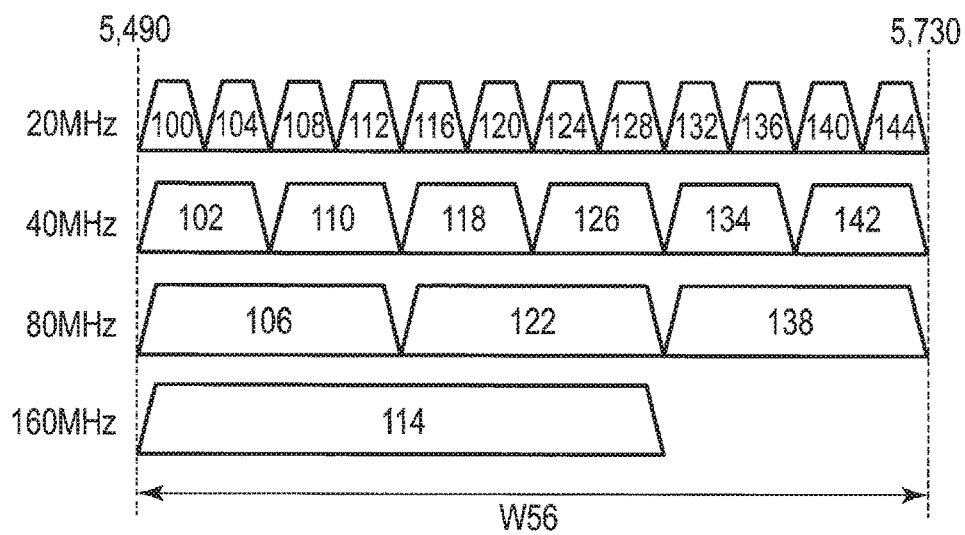
FIG. 5 is a view illustrating another example of the channel allocation of the wireless LAN of the IEEE802.11 standard in the case of being operated at 5,490 MHz to 5,710 MHz.
FIG. 6 is a view listing a center frequency of each channel of the wireless LAN of the IEEE802.11 standard to which the channels have been allocated as illustrated in FIG. 5.

W56 can be used up to 5,730 MHz as a frequency on the high side as illustrated in FIG. 5 in some countries or regions. Channel information representing a channel width and a channel position in this case may be stored in the memory 20.

When the channel width is 20 MHz, twelve communication channels with channel numbers 100, 104, 108, 112, 116, 120, 124, 128, 132, 136, 140, and 144 are allocated to W56 from 5,490 MHz to 5,730 MHz. When the channel width is 40 MHz, six communication channels with channel numbers 102, 110, 118, 126, 134, and 142 are allocated to W56. When the channel width is 80 MHz, three communication channels with channel numbers 106, 122, and 138 are allocated to W56. When a channel width is 160 MHz, one communication channel with a channel number 114 is allocated to W56.

As shown in FIG. 6, center frequencies of 5,500 MHz, 5,520 MHz, 5,540 MHz, 5,560 MHz, 5,580 MHz, 5,600 MHz, 5,620 MHz, 5,640 MHz, 5,660 MHz, 5,680 MHz, 5,700 MHz, and 5,720 MHz of twelve communication channels with channel numbers 100, 104, 108, 112, 116, 120, 124, 128, 132, 136, 140, and 144 having the channel width of 20 MHz are stored in the memory 20. Center frequencies 5,510 MHz, 5,550 MHz, 5,590 MHz, 5,630 MHz, 5,670 MHz, and 5,710 MHz of six communication channels with channel numbers 102, 110, 118, 126, 134, and 142 having the channel width of 40 MHz are also stored in the memory 20. Center frequencies 5,530 MHz, 5,610 MHz, and 5,690 MHz of three communication channels with channel numbers 106, 122, and 138 having the channel width of 80 MHz are also stored in the memory 20. Center frequency 5,570 MHz of one communication channel with the channel number 114 having the channel width of 160 MHz is also stored in the memory 20.

Figures 7, 8:
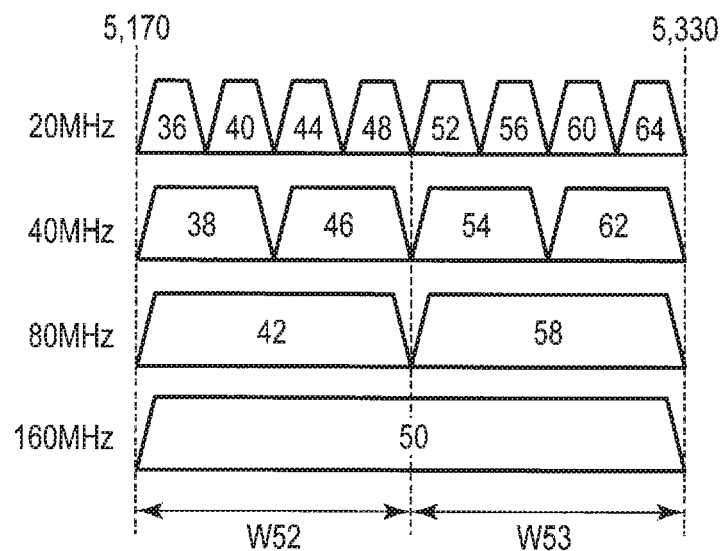
FIG. 7 is a view illustrating an example of channel allocation of the wireless LAN of the IEEE802.11 standard in the case of being operated at 5,170 MHz to 5,330 MHz.
FIG. 8 is a view listing a center frequency of each channel of the wireless LAN of the IEEE802.11 standard to which the channels have been allocated as illustrated in FIG. 7.

FIG. 7 illustrates the allocation of communication channels in which a frequency band from 5,170 MHz to 5,330 MHz available as the 5 GHz band in the wireless LAN of the IEEE802.11 standard. The frequency band from 5,170 MHz to 5,330 MHz may be divided into a 5.2 GHz band (also denoted by W52) from 5,170 MHz to 5,250 MHz and a 5.3 GHz band (also denoted by W53) from 5,250 MHz to 5,330 MHz.

When the channel width is 20 MHz, four communication channels with channel numbers 36, 40, 44, and 48 are allocated to W52, and four communication channels with channel numbers 52, 56, 60, and 64 are allocated to W53. When the channel width is 40 MHz, two communication channels with channel numbers 38 and 46 are allocated to W52, and two communication channels with channel numbers 54 and 62 are allocated to W53. When the channel width is 80 MHz, one communication channel with a channel number 42 is allocated to W52, and one communication channel with a channel number 58 is allocated to W53. When the channel width is 160 MHz, one communication channel with a channel number 50 is allocated across W52 and W53.

As shown in FIG. 8, center frequencies 5,180 MHz, 5,200 MHz, 5,220 MHz, 5,240 MHz, 5,260 MHz, 5,280 MHz, 5,300 MHz, and 5,320 MHz of eight communication channels with channel numbers 36, 40, 44, 48, 52, 56, 60, and 64 having the channel width of 20 MHz are stored in the memory 20. Center frequencies of 5,190 MHz, 5,230 MHz, 5,270 MHz, and 5,310 MHz of four communication channels with channel numbers 38, 46, 54, and 62 having the channel width of 40 MHz are also stored in the memory 20. Center frequencies 5,210 MHz and 5,290 MHz of the two communication channels with channel numbers 42 and 58 having the channel width of 80 MHz are also stored in the memory 20. A center frequency 5,250 MHz of one communication channel with channel number 50 having the channel width of 160 MHz is also stored in the memory 20.

Since channel information of the communication channel allocated to W52 is similar to the channel information of the communication channel allocated to W53, it is not necessary to store the entire channel information in the memory 20. It is sufficient to store the channel information of the communication channels allocated to W52 or W53 and information indicating W52 or W53 in the memory 20.

The entire channel information on the 5 GHz band available by the wireless LAN, for example, the channel information of the communication channels allocated to W56, W52, and W53 may be stored in the memory 20. In addition, channel information of a part of communication channels on the 5 GHz band available by the wireless LAN, such as the channel information of the communication channels allocated to W56 and W53, may be stored in the memory 20. Such a storage method is conceivable, for example, if an upper limit of a frequency used by the wireless power transmission apparatus 100 or 102 is 5,732 MHz (reference frequency) and a lower limit of the RF region (analog region) that can be covered is up to W53.

In addition, in the examples of FIGS. 3 to 8, the information on the channel position in the case where the channel width is each of 20 MHz, 40 MHz, 80 MHz, and 160 MHz is stored in the memory 20 as the channel information of the wireless LAN. However, only the information on the channel position when the channel width is 20 MHz may be stored in the memory 20, and center positions of the communication channels having the other channel widths may be obtained by simple calculation based on center positions of communication channels having the bandwidth of 20 MHz. For example, the center frequency of the communication channel with the channel number 102 having the channel width of 40 MHz is a frequency at a boundary between the two communication channels with the channel numbers 100 and 104 having the channel width of 20 MHz included in the communication channel with the channel number 102. The frequency at the boundary of the communication channels can be easily obtained based on the bandwidth and the center frequency of either one of the channels. The center frequency of the communication channel with the channel number 106 having the channel width of 80 MHz is a frequency at a boundary between the two communication channels with the channel numbers 104 and 108 having the channel width of 20 MHz included in the communication channel with the channel number 106. The center frequency of the communication channel with the channel number 114 having the channel width of 160 MHz is a frequency at a boundary between the two communication channels with the channel numbers 112 and 116 having the channel width of 20 MHz included in the communication channel with the channel number 114.

Although the channel numbers on the wireless LAN are attached to the communication channels in the examples of FIGS. 3 to 8, it is unnecessary for the wireless power transmission apparatus to store such information on the channel numbers as long as the following can be implemented.

Control Example of Power Transmission Frequency Band

Several examples of controlling the power transmission frequency band based on the channel information as described above will be described. First, a control example in a case where only channel information on a 20 MHz channel of a wireless LAN is stored in the memory 20 will be described.

Example 1: Power is Transmitted at Frequency of DC Component of 20 MHz Channel of Wireless LAN In the wireless LAN of the IEEE802.11 standard, it is fundamental to transmit a signal through a communication channel having a channel width of 20 MHz, except for some systems employing a frequency hopping system. In the wireless LAN of the IEEE802.11 standard (including extended family) using orthogonal frequency division multiplex (OFDM), for example, in the IEEE802.11a/g/n/ac/ax standards, a direct current (DC) component is positioned at the center frequency of the 20 MHz channel. Since no signal is transmitted in a certain frequency band of the DC component, a wireless LAN terminal performs DC offset cancellation when receiving a signal from another wireless terminal. When the wireless power transmission apparatus 100 or 102 selects a frequency band on a frequency of the DC component of at least one communication channel included in a communication frequency band of the wireless LAN that may operate within the power transmission region, as the power transmission frequency band. Thus, the power transmission microwaves do not interfere with or hardly interfere with the communication of the wireless LAN terminal due to the DC offset cancellation during reception processing on the wireless LAN terminal so that it is possible to maintain the communication performance of the wireless LAN.

For example, when a wireless LAN system with the channel allocation as illustrated in FIG. 3 may operate within the power transmission region of the wireless power transmission apparatus 100 or 102, the controller 18 of the wireless power transmission apparatus 100 or 102 transmits power in a frequency hand on any frequency selected from among the center frequencies (frequencies of the DC component) of 5,500 MHz, 5,520 MHz, 5,540 MHz, 5,560 MHz, 5,580 MHz, 5,600 MHz, 5,620 MHz, 5,640 MHz, 5,660 MHz, 5,680 MHz, and 5,700 MHz of the 20 MHz channels illustrated in FIG. 4.

[DC Band]

Although a bandwidth of a power transmission frequency of the wireless power transmission apparatus 100 or 102 is about 100 kHz, a subcarrier interval is 312.5 kHz in the wireless LAN of the IEEE802.11a/g/n standards (a 2.4 GHz band in the IEEE802.11g standard, but the same technique can be applied to the wireless LAN of the IEEE802.11g standard in the case of transmitting power in the 2.4 GHz band) and a bandwidth of its DC signal is sufficiently wider than a power transmission bandwidth. In addition, in the wireless LAN of the IEEE802.11ax standard, a subcarrier interval is 78.125 kHz, hut three subcarriers are allocated as a DC component at the minimum so that a bandwidth of a DC signal is 156.25 kHz (=78.125 kHz×2), and a band of the DC signal is also wider than the power transmission frequency band. Thus, even if the power transmission frequency band of the wireless power transmission apparatus somewhat deviates from the frequency band on the center frequency (the frequency of the DC component) of the 20 MHz channel, the effect of DC offset cancellation can be expected.

As an example, when a frequency band, which includes a frequency of a DC component of at least one communication channel included in a communication frequency band of a wireless LAN and does not include a frequency band of a data subcarrier closest to the frequency of the DC component, is selected as the power transmission frequency band, it is possible not to cause interference with the wireless LAN or to make the interference hardly occur. In this case, at least some of frequencies, sandwiched between a lower limit of the frequency band of a closest data subcarrier having a frequency band higher than the frequency of the DC component and an upper limit of the frequency band of a closest data subcarrier having a frequency band lower than the frequency of the DC component, is set as the power transmission frequency band.

As another example, when a frequency band, which includes a frequency of a DC component of at least one communication channel included in a communication frequency band of a wireless LAN and includes a frequency band of one or more (less than a threshold) data subcarriers closest to the frequency of the DC component, is selected as the power transmission frequency band, it is possible to make interference with the wireless LAN hardly occur.

[Frequency Offset]

Upon actual operations, it is possible to consider a case where there is an offset in frequencies of the wireless power transmission apparatus 100 or 102 and a center frequency of a power transmission frequency band deviates from a position of a DC component of a wireless LAN. Even in this case, however, no pilot subcarrier, which will be described later, exists in a frequency band in the vicinity of the DC component in the 20 MHz channel or a 80 MHz channel to be described later, and thus, a power transmission microwave does not overlap with the pilot subcarriers even if the power transmission frequency band deviates from the DC component of the wireless LAN, and as a result, the power transmission microwave does not interfere with or hardly interferes with the communication of the wireless LAN.

Since the wireless LAN is operating according to carrier sense multiple accesses with collision avoidance (CSMA/CA), retransmission is performed when a received signal is not decoded and a transmission acknowledgment frame (an Ack frame, a BlockAck frame, or the like) is not received from a transmitting terminal. Thus, even when it is difficult for the wireless LAN terminal to decode the received signal due to the influence of power transmission, the power transmission microwave does not interfere or hardly interferes with the communication of the wireless LAN due to the retransmission operation unless the power transmission continuously occupies more than a certain amount of time.

Example 2: Power Is Transmitted at Boundary of 20 MHz Channel of Wireless LAN

In the wireless LAN of the 5 GHz band, an actually occupied bandwidth is narrower than 20 MHz even when the 20 MHz channel is used. For example, an occupied bandwidth is within 19 MHz in the IEEE802.11a/n/ac standards, and an occupied bandwidth is 19.14 MHz in the IEEE802.11ax standard. Data subcarriers exist within the occupied bandwidth and do not exist outside the occupied bandwidth. When receiving a signal of the 20 MHz channel from another wireless LAN terminal, the wireless LAN terminal performs a reception process of cutting a noise component at a boundary of the channel by a filter in some cases. Accordingly, when power is transmitted in a frequency band which includes the frequency of the boundary of the 20 MHz channel and is not included in the occupied bandwidth, a power transmission microwave is cut so that the power transmission microwave does not interfere with or hardly interferes with the communication of the wireless LAN terminal. Therefore, it is possible to maintain the communication performance of the wireless LAN.

For example, when the wireless LAN with the channel allocation as illustrated in FIG. 3 operates within the power transmission region, the controller 18 transmits power in a frequency band on any frequency selected from among 5,490 MHz, 5,510 MHz, 5,530 MHz, 5,550 MHz, 5,570 MHz, 5,590 MHz, 5,610 MHz, 5,630 MHz, 5,650 MHz, 5,670 MHz, 5,690 MHz, and 5,710 MHz, which are frequencies corresponding to the boundary of the 20 MHz channel.

As an example, when a frequency band, which includes a frequency of a boundary between two neighboring communication channels included in communication frequency band of a wireless LAN and does not include a frequency band of a data subcarrier closest to the frequency of the boundary, is selected as the power transmission frequency band, it is possible not to cause interference with the wireless LAN or to make the interference hardly occur. In this case, at least some of frequencies, sandwiched between a lower limit of the frequency band of a closest data subcarrier having a frequency band higher than the frequency of the boundary and an upper limit of the frequency band of a closest data subcarrier having a frequency band lower than the frequency of the boundary, is set as the power transmission frequency band.

As another example, when a frequency band, which includes a frequency of a boundary of neighboring two communication channels included in a communication frequency band of a wireless LAN and includes a frequency band of one or more (less than a threshold) data subcarriers closest to the frequency of the boundary, is selected as the power transmission frequency band, it is possible to make interference with the wireless LAN hardly occur.

[Consideration of Channel of 40 MHz or More]

In the wireless LAN, a 40 MHz channel, and an 80 MHz channel can be also used in addition to the 20 MHz channel. When communication channels having these channel widths are used, a DC component at the center of the 40 MHz channel or the 80 MHz channel is positioned at a boundary of communication channels when considered in the 20 MHz channel. When power is transmitted in a frequency band having a DC component in a wireless LAN using a communication channel with a channel width of 40 MHz or more, the effect that the power transmission microwave does not interfere with or hardly interferes with the communication of the wireless LAN terminal is the same as that of the case where power is transmitted in the frequency band having the DC component in the wireless LAN using the communication channel with the channel width of 20 MHz.

When a wireless LAN using the 40 MHz channel with the channel allocation as illustrated in FIG. 3 operates within the power transmission region of the wireless power transmission apparatus 100 or 102, the controller 18 of the wireless power transmission apparatus 100 or 102 transmits power in a frequency band on any frequency selected from among the center frequencies of 5,510 MHz, 5,550 MHz, 5,590 MHz, 5,630 MHz, and 5,670 MHz of the 40 MHz channel illustrated in FIG. 4. Similarly, when a wireless LAN system using the 80 MHz channel with the channel allocation as illustrated in FIG. 3 operates within the power transmission region, the controller 18 transmits power in a frequency band on any frequency selected from among the center frequencies 5,530 MHz and 5,610 MHz of the 80 MHz channels illustrated in FIG. 4.

On the other hand, a channel width used in a certain wireless LAN system is not always uniform. In addition, when terminals of a plurality of wireless LAN systems exist within the power transmission region, there is a possibility that the terminals may operate either on the same communication channel or on different communication channels. However, center frequencies of the 40 MHz channel or the 80 MHz channel are positioned at boundaries of the 20 MHz channels. Thus, if power is transmitted in a frequency band on the center frequencies of the 40 MHz channel and the 80 MHz channel assuming that the wireless LAN terminals of the 40 MHz channel and the 80 MHz channel operate within the power transmission region, a power transmission microwave does not interfere with or hardly interferes with communication of the wireless LANs of the 40 MHz channel and the 80 MHz channel. Further, since the center frequency of the 40 MHz channel or the 80 MHz channel is the frequency corresponding to the boundary of the 20 MHz channel, a power transmission component is cut by the filter even in the communication of the wireless LAN using the 20 MHz channel as described above. Therefore, the power transmission microwave does not interfere with or hardly interferes even with the communication of the wireless LAN using the 20 MHz channel.

Thus, in a case where it is difficult to specify one channel width to be used in the wireless LAN (including a case where it is difficult to determine or is not determined whether the wireless LAN terminal exists within the power transmission region), the effect of reducing the interference with the communication of the wireless LAN can be expected to some extent even if a communication channel of any channel width is used as long as power is transmitted in a frequency band on the frequency corresponding to the boundary of 20 MHz channels. Alternatively, when it is assumed that the wireless LAN terminal using the channels having the channel widths of 40 MHz or more, that is, channel bonding, operates within the power transmission region, power is transmitted in the frequency band on the frequency corresponding to the boundary of the 20 MHz channel, for example. As a result, a transmission microwave does not interfere with or hardly interferes with the communication of the wireless LAN due to the filter cut in the case of the 20 MHz channel. In the case of the channels of 40 MHz, 80 MHz, and 160 MHz, a transmission microwave does not interfere with or hardly interferes with the communication of the wireless LAN system due to DC offset cancellation.

In addition, when it is assumed that the wireless LAN system of the 20 MHz channel operates within the power transmission region, power transmission may be performed in the center frequency of the 20 MHz channel. In order to make the above determination, a frequency band shared with the wireless LAN system may be scanned out of the frequency bands as use candidates of the wireless power transmission apparatus.

[Regarding 160 MHz and 80+80 MHz Channels]

In addition, the channel width of the wireless LAN includes a 160 MHz channel and an 80+80 MHz channel. The 80+80 MHz channel has a channel width of 160 MHz, but there is an interval between one 80 MHz channel and the other 80 MHz channel. The interval is 20 MHz or more. On the other hand, it is possible to say that the 160 MHz channel has an interval of 0 MHz. In the wireless LAN of the IEEE802.11 standard, the 160 MHz channel can also be handled as a set of two 80 MHz channels. That is, a channel on the lower side of the 160 MHz channel of or 80+80 MHz channel and an 80 MHz channel on the upper side of the 160 MHz channel of or 80+80 MHz channel are the same as the 80 MHz channel. A frequency corresponding to a position of a DC component and a frequency corresponding to a position of the pilot subcarrier to be described later the 80 MHz channel can be directly applied to a frequency corresponding to a position of a DC component and a frequency corresponding to a position of the pilot subcarrier in the 160 MHz channel.

Example 3: No Power is Transmitted at Position of Pilot Subcarrier

In a wireless LAN using OFDM, an OFDM signal is demodulated using a pilot signal. Amplitude and a phase variation in a communication channel are detected from a reception signal level of the pilot signal in a known frequency band, characteristics of the communication channel are estimated, and the reception signal is corrected according to the estimated characteristics. Some OFDM subcarriers are used for transmission of this pilot signal. The subcarrier that transmits the pilot signal will be referred to as the pilot subcarrier. In the IEEE802.11a standard using the 20 MHz channel, the pilot subcarriers are positioned at four locations in the 20 MHz channel. Even in the IEEE802.11g or IEEE802.11n standard using OFDM, the pilot subcarriers are positioned at four locations in the 20 MHz channel. Thus, the power transmission frequency band may be determined by avoiding a frequency band of the pilot subcarrier serving as an important factor for the OFDM decoding.

In the wireless LAN using the 40 MHz channel, the 80 MHz channel, or the 160 MHz channel, there is a possibility that the frequency band of the pilot subcarrier is not the same frequency band in the wireless LAN using the 20 MHz channel. Thus, for example, when it is assumed that the wireless LAN systems having a plurality of channel widths operate within the power transmission region, the controller 18 of the wireless power transmission apparatus 100 or 102 preferentially select a frequency band having no pilot subcarrier in the wireless LAN having any channel width of the 40 MHz channel, the 80 MHz channel, and the 160 MHz channel, as the power transmission frequency band. That is, since no pilot subcarrier is allocated in the center frequency of the 20 MHz channel in both the wireless LAN having 40 MHz channel and the wireless LAN having 80 MHz channel, it is sufficient to transmit power in a frequency band on the center frequency of the 20 MHz channel of the wireless LAN system which can operate within the power transmission region or a frequency corresponding to the boundary of the 20 MHz channel, that is, in the frequency band on the frequencies at an interval of 10 MHz.

FIG. 9 shows center frequencies of subcarriers the wireless LAN of the IEEE802.11ax standard for each channel width. The center frequencies of the pilot subcarriers are arranged to be bilaterally symmetric with a position of the center frequency of the channel as zero. A number indicates the number of subcarriers (interval of 78.125 kHz).

Figure 10:
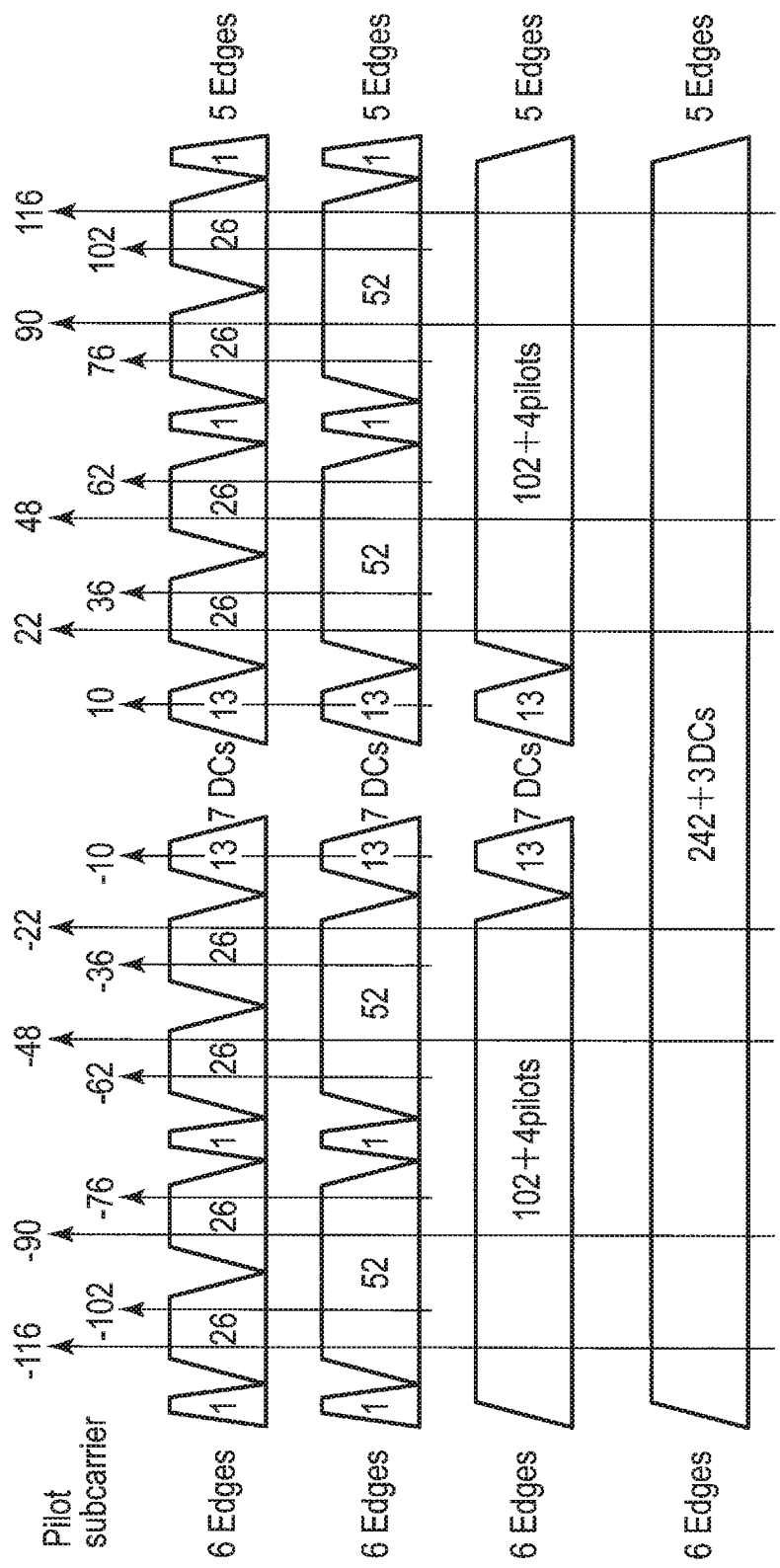
FIG. 10 is a view illustrating positions of the pilot subcarriers in the wireless LAN of the IEEE802.11ax standard when a channel width is 20 MHz.

FIG. 10 illustrates the center frequency of the pilot subcarrier in the wireless LAN of the IEEE802.11ax standard when the channel width is 20 MHz.

Figures 11, 12, 13, 14:
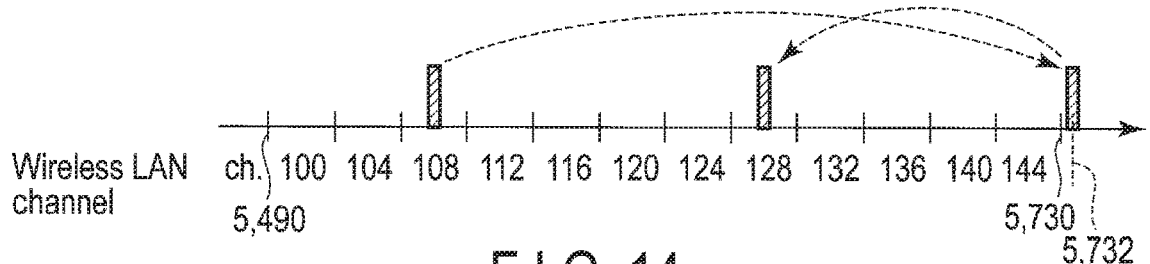
FIG. 11 is a view listing positions of the pilot subcarriers in a wireless LAN of the IEEE802.11a standard.
FIG. 12 is a view listing positions of the pilot subcarriers in a wireless LAN of the IEEE802.11n standard for each channel width.
FIG. 13 is a view listing positions of the pilot subcarriers in a wireless LAN of the IEEE802.11ac standard for each channel width.
FIG. 14 is a view illustrating an example of frequency hopping of a power transmission radio wave according to a second embodiment.

FIG. 11 shows the center frequencies of the pilot subcarriers in the wireless LAN of the IEEE802.11a standard (channel width is only 20 MHz). FIG. 12 shows the center frequencies of the pilot subcarriers in the wireless LAN of the IEEE802.11n standard (channel widths are 20 MHz and 40 MHz) for each channel width. FIG. 13 shows the center frequencies of the pilot subcarrier in the wireless LAN of the IEEE802.11ac standard (channel widths are 20 MHz, 40 MHz, 80 MHz, and 160 MHz) for each channel width. In the IEEE802.11a/n/ac standards, a subcarrier interval is 312.5 kHz which is four times of a subcarrier interval of the IEEE802.11ax standard, and the number of subcarriers is relatively small.

As described above, power is transmitted in a significant frequency band that does not interfere with or hardly interferes with the communication of the wireless LAN system that is likely to exist within the power transmission region in the first embodiment.

Although the information on the channel width and the channel position has been exemplified as the channel information of the wireless LAN to be stored in the first embodiment, the embodiment is not limited thereto. It suffices that the wireless power transmission apparatus can select the significant frequency band that is not affected by power transmission on the channel of the wireless LAN, and the information to be stored is not limited thereto. For example, only the significant frequency bands of the wireless LAN, for example, the center frequencies of the 20 MHz channels and/or the frequencies of the boundary of the 20 MHz channels may be stored.

In addition, the wireless LAN system of the IEEE802.11 standard has been escribed as the wireless system that is likely to exist within the power transmission region in the first embodiment, but it is possible to achieve the coexistence using the same technique even in other wireless communication systems.

In this manner, to restrict the frequency band to be selected as the power transmission frequency does not require broadening of the frequency band of the power transmission antenna 12 and also has an effect that is possible to alleviate a design load of the antenna.

Second Embodiment

A configuration of a second embodiment is the same as the configuration of the first embodiment illustrated in FIGS. 1 and 2. A method of selecting a power transmission frequency band performed by the controller 18 is different from that of the first embodiment. Although the power transmission frequency band is constant in the first embodiment, so-called frequency hopping in which the power transmission frequency band changes with a lapse of time is adopted in the second embodiment. A frequency band changed by the frequency hopping is one of the frequency hands selected in accordance with the first embodiment. FIG. 14 illustrates an example of the change in the power transmission frequency band selected by the controller 18 of the second embodiment. FIG. 14 illustrates an example of the frequency hopping when a wireless LAN with channel allocation as shown in FIG. 3 operates in a 20 MHz channel. The controller 18 sequentially selects a frequency band on a center frequency of a channel 108 in W56 during first power transmission, a frequency band on 5,732 MHz, which is an example of a reference frequency of a wireless power transmission apparatus, outside W56 during second power transmission, and a frequency band on a center frequency of a channel 128 in W56 during third power transmission, as the power transmission frequency band.

When the power transmission frequency band is fixed and the power transmission frequency band exists in an adjacent or next adjacent channel of an operation channel of the wireless LAN, there is a possibility that an RF component of the wireless LAN is saturated. By adopting the frequency hopping, it is possible to prevent such interference of power transmission microwaves from deviating to some channels.

A time interval to change the power transmission frequency band may be fixed or variable. For example, the power transmission frequency band may be hopped at every power transmission, the frequency band may be hopped after an arbitrary number of times of power transmission, or the frequency band may be hopped when a predetermined condition is satisfied. The number of times of hopping may be at least once. When power transmission and reception of a beacon signal are performed in a time-division manner, the periodicity of the time interval to change the power transmission frequency band may be disrupted.

In a frequency hopping system in the ordinary wireless communication system, a frequency hopping pattern needs to be shared beforehand between a transmission side and a reception side. This is because a wireless signal needs to be decoded on the reception side. In a wireless power feeding system, however, power is transmitted from the power transmission apparatus to the power receiving terminal via a continuous wave, and it is sufficient for the power receiving terminal to receive the continuous wave in a broadband radio frequency. Therefore, a frequency band of the broadband radio frequency is coincident between the power transmission apparatus and the power receiving terminal, it is unnecessary to share the hopping pattern in advance if the frequency hopping is performed within the frequency band.

According to the second embodiment, by distributing the power transmission frequency band that can interfere with other wireless communication system on a frequency axis by the frequency hopping, it is possible to prevent the interference of the power transmission microwave from deviating to only some channels of the communication system, for example, even if it is difficult to identify an operating frequency band of the communication system that is likely to operate within the power transmission region.

The power transmission frequency to be changed by the frequency hopping is selected based on the first embodiment. That is, the frequency hopping is performed among frequency bands which include frequencies (center frequencies of 20 MHz channels of the wireless LAN) where DC components of the 20 MHz channels exist but do not include frequency bands of data subcarriers closest to the frequency bands; frequency bands which include frequencies of channel boundaries of the 20 MHz channels but does not include frequency bands of the data subcarriers; and frequency bands other than frequency bands of pilot subcarriers of the wireless LAN.

As described above, a DC position of a wireless LAN corresponds to a center of a bandwidth of a channel, and a center position of the 40 MHz or 80 MHz channel corresponds to a boundary of the 20 MHz channel. Thus, the frequency hopping may be performed at an interval of 10 MHz.

Further, the frequency hopping may be performed at the boundary of the 20 MHz channel at an interval of 20 MHz in a wireless LAN system using channel bonding.

[Avoidance of Continuous Interference with Same Wireless LAN System]

Figure 15:
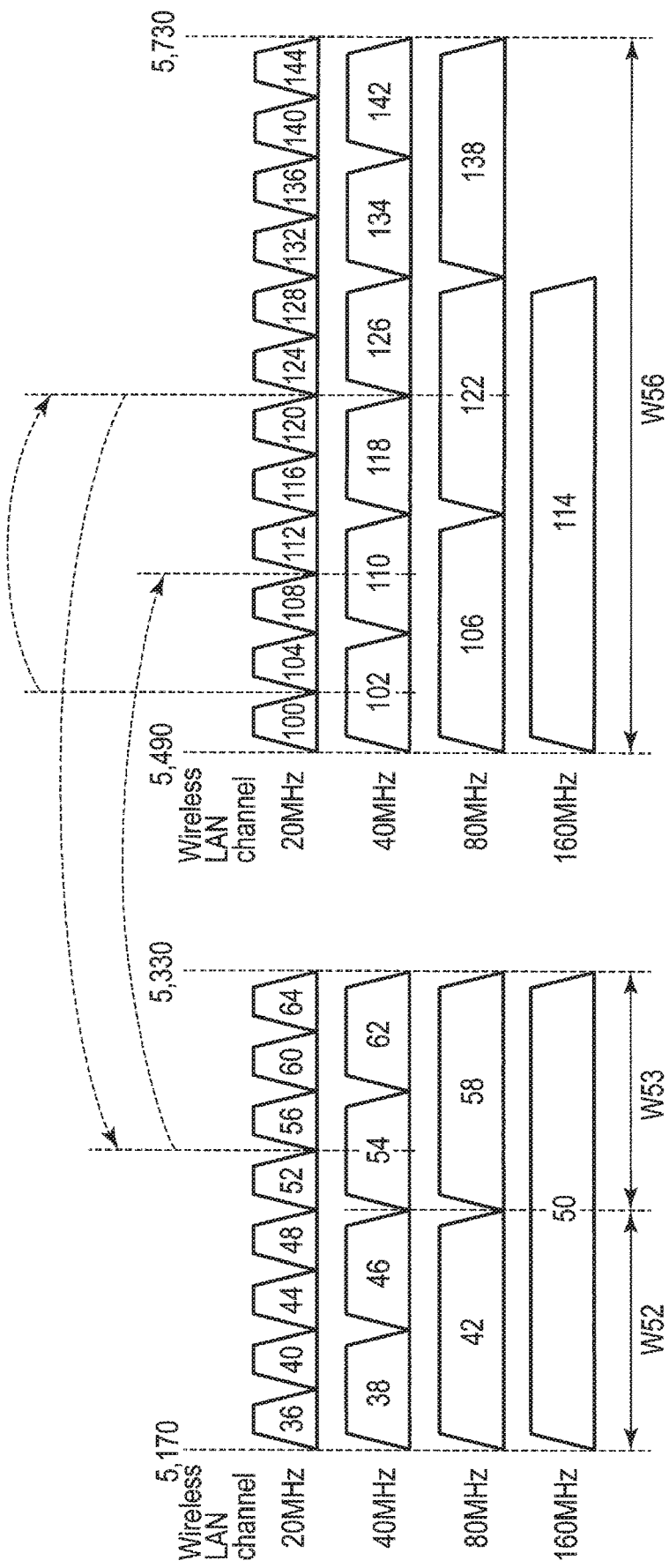
FIG. 15 is a view illustrating another example of frequency hopping of the power transmission radio wave according to the second embodiment.

FIG. 15 illustrates an example of frequency hopping according to another modified example of the second embodiment. In the modified example, for example, a frequency band that is likely to be continuously used in the same system, such as the 40 MHz channel or the 80 MHz channel of the wireless LAN, is not selected at the next hop. That is, the frequency hopping is performed such that a frequency band selected next is separated from a current frequency band by 40 MHz or 80 MHz or more. It is assumed that a hopping frequency is selected from frequencies corresponding to boundaries of the 20 MHz channels. For example, the controller 18 selects a frequency band on frequencies of boundaries between channels 120 and 124 in W56 as the power transmission frequency next to a frequency band on boundaries between channels 100 and 104 in W56, then selects a frequency band on boundaries between channels 52 and 56 in W53, and then, selects a frequency band on boundaries between channels 108 and 112 in W56 as the power transmission frequency band.

Although a power transmission frequency includes a channel 144 assuming a combination of FIGS. 5 and 7 in FIG. 15, the power transmission frequency may not necessarily include the channel 144 assuming a combination of FIGS. 3 and 7. When it is assumed that the wireless LAN that is likely to exist within the power transmission region uses the 160 MHz channel, the frequency hopping may be performed such that W56 and W52 or W53 are alternately selected. In this manner, it is possible to eliminate intensive interference of a power transmission microwave with one of the two channels to be used in the wireless LAN system using channel bonding.

Although a frequency band of a beacon signal may be subjected to the frequency hopping, the frequency band of the beacon signal may be set to a frequency band on a fixed frequency such as 5,732 MHz, which is the reference frequency (without the frequency hopping) and the frequency hopping may be performed only in the power transmission frequency hand of the power transmission microwave from the wireless power transmission apparatus 102. In this case, the wireless power receiving terminal 202 does not need to perform the operation of switching the frequency band, and only the wireless power transmission apparatus 102 may perform the operation of switching the frequency band.

To perform the frequency hopping by restricting the frequency band to be selected does not require broadening of the frequency band of the power transmission antenna 12, and also has an effect that is possible to alleviate the design load of the antenna.

Third Embodiment

Although the power transmission frequency band has been controlled in the first and second embodiments, an example of controlling a power transmission time for frequency sharing with a wireless system will be described as a third embodiment. The third embodiment is implemented when a power transmission frequency band is selected based on the first embodiment and power is transmitted in the selected frequency band or is implemented when a power transmission frequency band is sequentially changed depending on a time based on the second embodiment and power is transmitted in the changed frequency band. A configuration of the third embodiment is the same as the configuration of the first embodiment illustrated in FIGS. 1 and 2. A time, which is different from the first and second embodiments.

[Transmission Time Is Lengthened to Prevent Erroneous Detection as Radar]

When recognizing a radar signal, a wireless LAN performs an operation, which is so-called dynamic frequency selection (DES), of stopping an operation of a channel that is currently operating so as not to give interference to radar or to hardly give interference and switching the channel to another channel. In a case where a wireless system that is likely to exist within a power transmission region is a wireless LAN system that is obliged to detect radar, there is a possibility that a narrow-band signal is erroneously recognized as a radar signal when it is determined that the wireless LAN system has detected the narrow-band signal. Thus, a study on a new wireless LAN standard using the narrow-band signal has a policy to take measures to limit the use of a narrow-band signal in a frequency band in which a legacy wireless LAN access point based on the conventional standard performs the DES operation such that the legacy wireless LAN access point does not erroneously detect as radar the narrow-band signal which is defined by a new standard. The transmission band of the wireless power transmission apparatus 100 or 102 of the first and second embodiments is about 100 kHz, and is narrower than a signal of the legacy wireless LAN, and thus, there is a possibility that the legacy wireless LAN access point erroneously detects power transmission microwaves from the wireless power transmission apparatus 100 or 102 as the radar signal.

In order to prevent such erroneous detection, the controller 18 of the wireless power transmission apparatus 100 or 102 controls an oscillation time of the oscillator 16 to make a power transmission time longer than a pulse length used by the radar as a DFS operation target. Thus, a maximum pulse length to be used by one or a plurality of radars as the DFS operation target by the wireless LAN is stored in advance in the memory 20. Alternatively, this maximum pulse length may be input to the controller 18 before power transmission. For example, the maximum pulse length of the radar operating in W56 is stored in advance in the memory 20 when the power transmission frequency band is selected from W56, and a maximum pulse length of the radar operating in W53 is stored in advance in the memory 20 when the power transmission frequency band is selected from W53. The controller 18 reads any maximum pulse length from the memory 20 according to the power transmission frequency band to control the operation of the oscillator 16 such that the power transmission time is longer than the maximum pulse length. In order to deal with a fact that the maximum pulse length of the radar to be used differs depending on a country or a region, it may be configured such that maximum pulse lengths of radars to be used in various countries or regions are stored in the memory 20. An operation area of the wireless power transmission apparatus 100 or 102 can be designated such that the maximum pulse length corresponding to the designated area is selected.

In addition, when a frequency band in which the wireless LAN is required to perform the DFS operation is used for power transmission, the power transmission time may be set to be equal to or longer than an assumed maximum pulse length without designating detailed operation area and frequency band. For example, a pulse length of a C-band meteorological radar is usually about 400 μs at the longest. Therefore, when considering frequency sharing with a wireless LAN having the C-band meteorological radar as the DFS operation target, it is sufficient to set the power transmission time longer than 400 μs.

Figure 16:
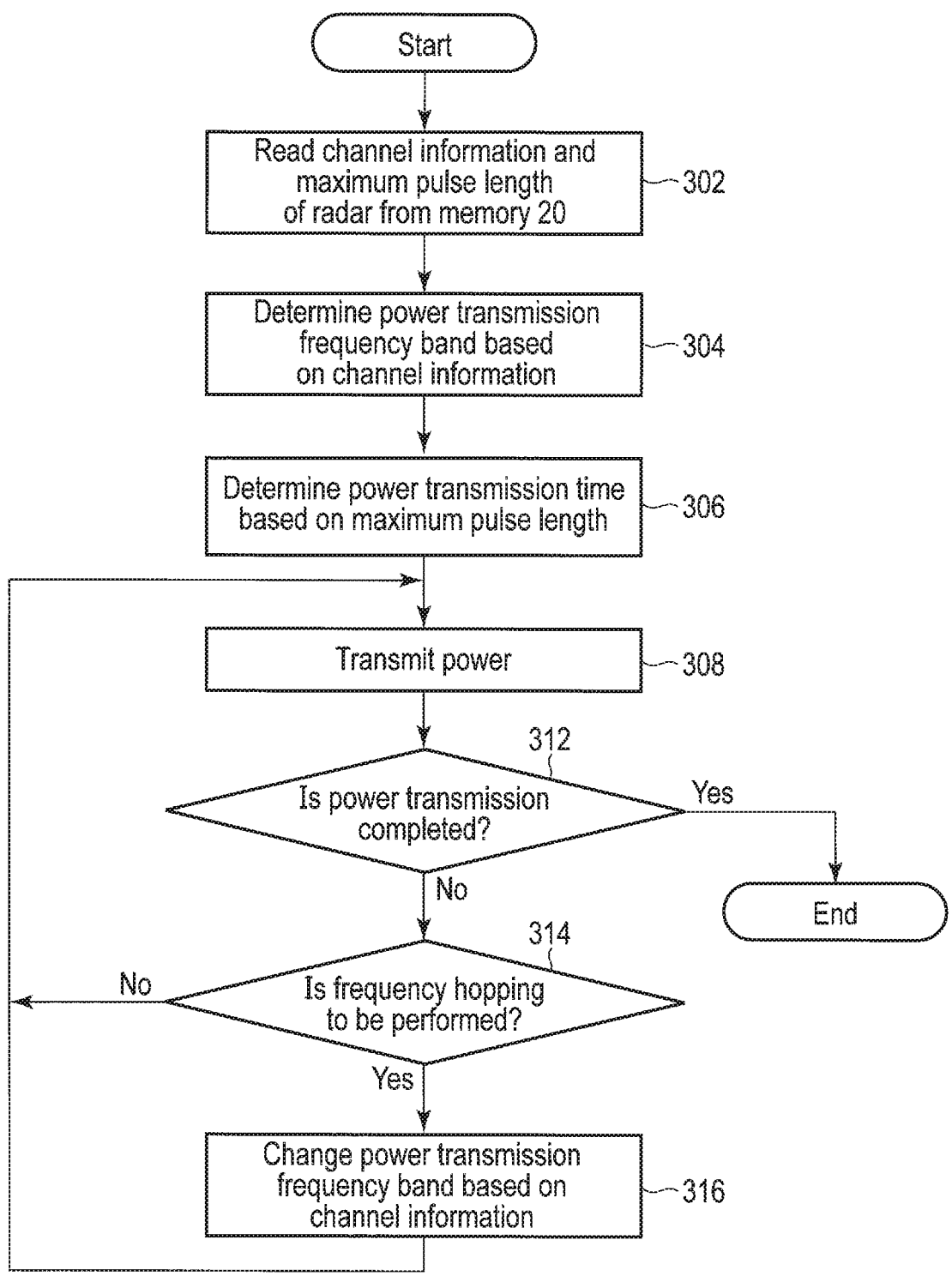
FIG. 16 is a flowchart illustrating an example of power transmission control according to a third embodiment.

FIG. 16 is a flowchart illustrating an example of a process of controlling the power transmission time to prevent erroneous detection as the radar signal. In Block 302, the controller 18 reads channel information and the maximum pulse length of the radar from the memory 20. In Block 304, the controller 18 determines the power transmission frequency band based on the channel information in the same manner as in the first embodiment. In Block 306, the controller 18 determines the power transmission time (time longer than the maximum pulse length) based on the maximum pulse length of the radar. In Block 308, the controller 18 performs power transmission once based on these control information.

In Block 312, the controller 18 determines whether the power transmission has been completed. When the power transmission has been completed, the process is ended. When the power transmission has not been completed, the controller 18 determines in Block 314 whether frequency hopping has been set. If frequency hopping has not been set, the controller 18 performs the next power transmission using the same power transmission frequency band and power transmission time as in the previous power transmission in Block 308. When the frequency hopping has been set, the controller 18 changes the power transmission frequency band (performs frequency hopping) based on the channel information in the same manner as in the second embodiment in Block 316. Thereafter, the controller 18 performs the next power transmission using the changed power transmission frequency band and the same power transmission time as that at the time of the previous power transmission in Block 308.

The transmission power of the wireless power transmission apparatus 100 or 102 is larger than that of the wireless LAN, and thus, the amount of interference given to the radar is larger than that of the wireless LAN. Therefore, there is a possibility that power transmission microwaves give serious influence on the operation of the radar. An operating frequency band of the radar can be used for power transmission only if it is guaranteed not to hinder the operation of the radar, for example, there is sufficient separation distance from the radar. Since the wireless LAN can be basically used without being affected by the limitation such as the separation distance from the radar by implementing the DFS operation, it is important to adjust the power transmission time in order to avoid erroneously detecting the power transmission microwave as the radar at the legacy wireless LAN access point.

[Transmission Time is Shorten to such Extent that Wireless LAN is Not Detectable]

Alternatively, on the contrary, the power transmission time may be shortened such that the legacy wireless LAN access point cannot detect the power transmission microwave. The wireless LAN performs carrier sense of a wireless channel in order to perform the CSMA/CA operation. The time required to detect that the wireless channel is being used (the wireless channel is busy) is several μs (for example, 2 μs) at the shortest. Thus, if the power transmission time is shorter than such time, it is difficult for the wireless LAN to detect the power transmission microwave and there is no influence to transmission determination of the wireless LAN. In addition, if the power transmission time is short in this manner, the influence of the power transmission microwave to the communication of the wireless LAN becomes minor, and the influence on the power transmission can be avoided in the wireless LAN by error correction and the above-described retransmission control.

When power transmission is repeated in the same frequency band as in the first embodiment, a one-time power transmission time is set to several μs (for example, 2 μs) or less, and enough time is given between one power transmission and the next power transmission. A reason for setting the enough time between successive power transmissions is that the wireless LAN recognizes two signals between which a time interval is too short as one same signal. For example, a time interval from one power transmission to the next power transmission may be equal to or longer than the time (several μs) required for detecting the busy state of the wireless channel. Alternatively, a so-called short interframe space (SIFS) is defined the wireless LAN as the shortest time for switching between transmission and reception. The time interval from one power transmission to the next power transmission may be the SIFS or more. The SIFS is 16 μs in the case of using a channel having a channel width of 20 MHz or more in the 5 GHz band.

Alternatively, when transmission is performed using a plurality of consecutive 20 MHz channels such as a 40 MHz channel in a wireless LAN, a PIFS (Point Coordination Function Interframe Space Or Point Interframe Space) is defined as the time required for carrier sense on an extended channel (referred to as a secondary channel or a secondary 20 channel in the case of the 40 MHz channel). A reference 20 MHz channel against the extended channel is referred to as a primary channel or a primary 20 channel. The time interval from one power transmission to the next power transmission may be set to the PIFS or more. The PIFS is obtained by adding a so-called Slot time to the above SIFS time, and is usually 25 μs in a system using a channel of 20 MHz or more in the 5 GHz band. Alternatively, the time interval from one power transmission to the next power transmission may be longer than a typical time length such as AckTimeout used in the wireless LAN. This AckTimeout time is determined based on the SIFS time by taking into account the Slot time and a delay time at which a wireless packet is received and detected. Since the delay time for receiving and detecting this wireless packet is defined by each wireless LAN system, for example, a maximum time in a wireless LAN system coexisting in a frequency band to be used may be selected and used as the time interval, or an interval equal to or longer than a typical occupied time length of a certain frame used in the wireless LAN, for example, an acknowledgment (Ack) frame may be used.

The memory 20 of the wireless power transmission apparatus 100 or 102 may also store the SIFS or PIFS of the wireless LAN, and the controller 18 may control power transmission based on these values. Both the SIFS and PIFS have different values between the 5 GHz band and the 2.4 GHz band. In the 2.4 GHz band, the SIFS is 10 μs and the PIFS is 19 μs. Therefore, when there is a possibility that the operating frequency band is either 5 GHz band or 2.4 GHz band, it is sufficient for the memory 20 to store time interval information of the wireless LAN in both the bands.

FIG. 17 is a flowchart illustrating an example of a process of shortening the transmission time to such an extent that the wireless LAN is not detectable. The controller 18 reads channel information and the SIFS or PIFS from the memory 20 in Block 322. In Block 324, the controller 18 determines the power transmission frequency band based on the channel information in the same manner as in the first embodiment. In Block 326, the controller 18 sets the power transmission time to be equal to or shorter than the time required for the CSMA/CA operation. In Block 328, the controller 18 performs power transmission once based on these control information.

In Block 332, the controller 18 determines whether the power transmission has been completed. When the power transmission has been completed, the process is ended. When the power transmission has not been completed, the controller 18 stands by for a time based on, for example, the SIFS or PIFS in Block 334. Thereafter, the controller 18 performs the next power transmission using the same power transmission frequency and power transmission time as those of the previous power transmission in Block 328.

Even in the case of adopting the frequency hopping as in the second embodiment, the time for one power transmission may be set to several μs (for example, 2 μs) or less, and the time based on, for example, the SIFS or PIFS may be given from one power transmission to the next power transmission.

As the power transmission time is set to be short in this manner, there is a possibility that a bandwidth of the power transmission microwave spreads from, for example, the above 100 kHz to about 1 MHz. In addition, when the frequency hopping is performed as in the second embodiment, there is a possibility that it takes time on the order of 100 μs to switch frequencies. However, if a frequency deviation of 20 ppm or more is allowed before the frequency stabilizes, the frequency may be switched within a time shorter than 100 μs.

Fourth Embodiment

A configuration of a fourth embodiment is the same as the configuration of the first embodiment illustrated in FIGS. 1 and 2. The fourth embodiment relates to control of transmission power. After determining a power transmission frequency band according to the first embodiment or the second embodiment, the controller 18 controls an amplification degree of the amplifier 14 so as to control transmission power to be transmitted for each time. The transmission power is varied so as to be inversely proportional to a power transmission time.

Combination with Second Embodiment

For example, when the power transmission frequency band is subjected to frequency hopping based on the second embodiment, the controller 18 decreases transmission power when the power transmission time in one frequency band is long, and increases the transmission power when the power transmission time is short. The power transmission time is set at the time of operating a wireless power feeding system or the like, and power transmission time is fixed for each frequency band during an operation of the power feeding system. When changing the power transmission time according to an operation pattern, such a relationship is established between the operation patterns selecting different power transmission times.

[Relationship Between Frequency Hopping and Transmission Power]

For example, the controller 18 may decrease the transmission power when the power transmission frequency band is a frequency band on 5,732 MHz (reference frequency) or a fixed frequency band selected based on the first embodiment (no frequency hopping), and may increase the transmission power when the second embodiment or the first and second embodiments can be selected and the frequency hopping is available. The reason is because, the transmission power may be decreased if the power transmission frequency band is the fixed frequency band since there is a high possibility of continuous interference to the same channel of a wireless communication system, and the transmission power may be increased if the influence of interference is dispersed by the frequency hopping.

Figure 18:
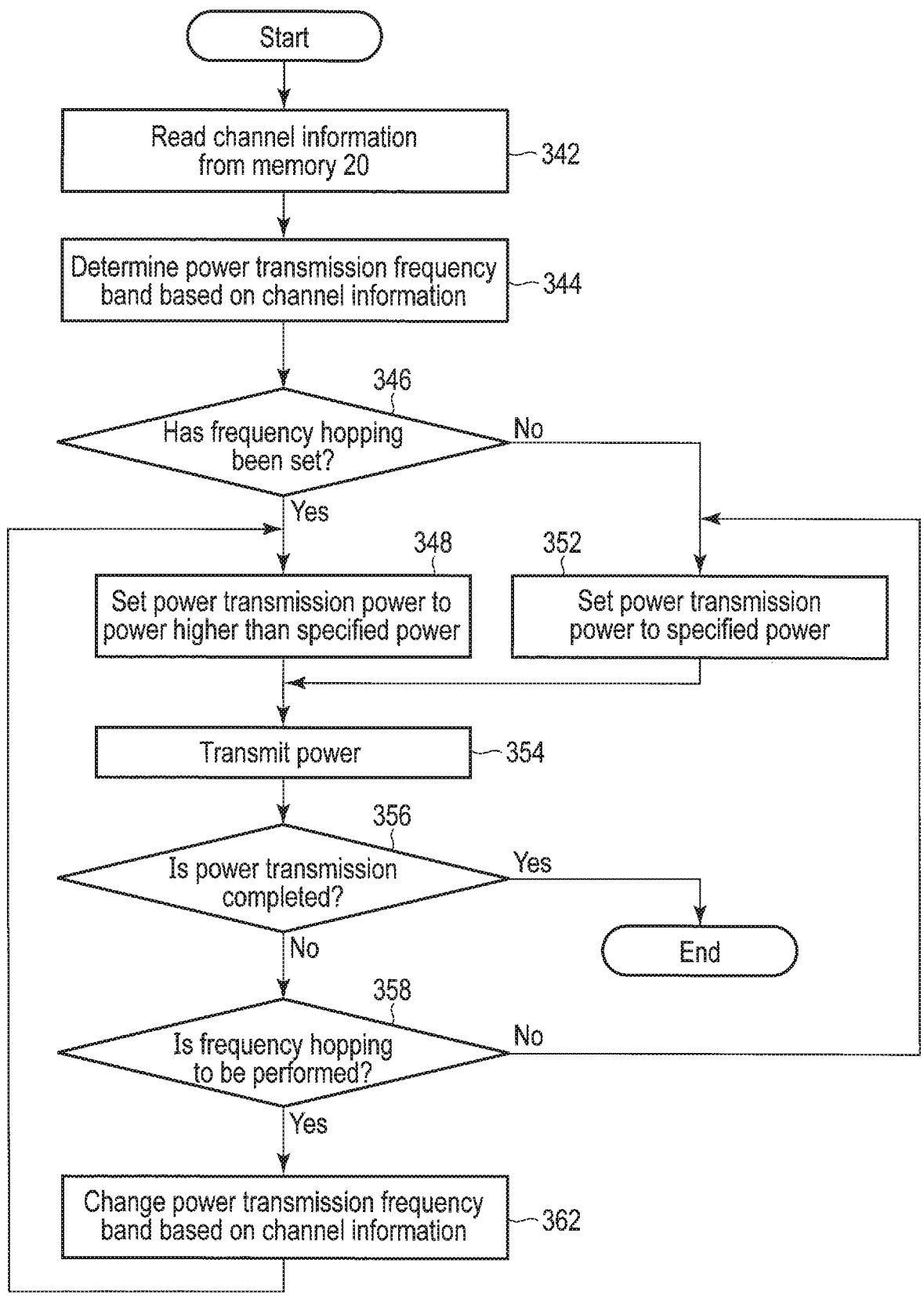
FIG. 18 is a flowchart illustrating an example of power transmission control according to a fourth embodiment.

FIG. 18 is a flowchart illustrating an example of a process of controlling the transmission power in accordance with whether or not frequency hopping is performed. The controller 18 reads channel information from the memory 20 in Block 342. In Block 344, the controller 18 determines the power transmission frequency band based on the channel information in the same manner as in the first embodiment. The controller 18 determines whether frequency hopping has been set, in Block 346. If the frequency hopping has not been set, the controller 18 sets the transmission power to certain specified power in Block 352. If the frequency hopping has been set, the controller 18 sets the transmission power to be greater than the specified power in Block 348. In Block 354, the controller 18 performs power transmission once based on these control information.

In Block 356, the controller 18 determines whether the power transmission has been completed. When the power transmission has been completed, the process is ended. If the power transmission has not been completed, the controller 18 determines whether the frequency is to be hopped or not, in Block 358. If the frequency is not to be hopped, the controller 18 sets the transmission power to the specified power in Block 352. If the frequency is to be hopped, the controller 18 changes (performs frequency hopping of) the power transmission frequency band in the same manner as in the second embodiment based on the channel information in Block 362. Thereafter, the controller 18 sets the transmission power to power higher than the specified power in Block 348, and performs the next power transmission using the changed power transmission frequency hand and the transmission power that is higher than the specified power in the Block 354.

[Relationship Between Power Transmission Time and Transmission Power]

Alternatively, in order to reduce the influence of interference, the controller 18 may decrease one-time transmission power if the total power transmission time required for wireless power receiving terminal 200 or 202 to fully charge a battery is long, and may decrease the one-time transmission power if the total power transmission time required to fully charge the battery is short. Wireless power transmission apparatus 100 or 102 can grasp the total power transmission time required to fully charge the battery, for example, by acquiring each battery capacity of the wireless power receiving terminal 200 or 202 in advance or by being notified by the wireless power receiving terminal 200 or 202 via a beacon signal or the like. That is, it is also possible to adjust the transmission power based on the battery capacity, instead of the total power transmission time required to fully charge the battery. If the total power transmission time is long, there is a high possibility that a power transmission microwave interferes with other surrounding wireless communication systems. If the one-time transmission power is decreased when the total power transmission time is long in order to avoid such interference, a sum of interference of the power transmission microwave to a wireless LAN when the power transmission time is short becomes equal to a sum of interference of the power transmission microwave to the wireless LAN when the power transmission time is long.

[Relationship Between 5,732 MHz and Frequency of Another Wireless LAN]

In addition, for example, when a wireless communication system operating within the power transmission region does not operate in the vicinity of a reference frequency of 5,732 MHz of a wireless power transmission apparatus, but the wireless power transmission apparatus adopts frequency hopping as in the second embodiment and a selected frequency bands include 5,732 MHz, the transmission power may be increased for the frequency band on 5,732 MHz, and the transmission power may be decreased for frequency bands that are likely to be used by the wireless communication system.

As the transmission power is adjusted in accordance with whether or not the frequency hopping is performed or in accordance with the power transmission frequency band in this manner, a reference frequency band is allocated exclusively to the wireless power feeding system. Therefore it is possible to reduce the degree that the power transmission microwave interferes with the wireless communication system, and it is possible to perform power transmission efficiently in the reference frequency band, under the situation that a wireless communication system uses other frequency bands.

Fifth Embodiment

A configuration of the fifth embodiment is the same as the configuration of the first embodiment illustrated in FIGS. 1 and 2. The fifth embodiment relates to determination to start the operation of the first embodiment and/or the second embodiment.

Since the transmission power of the wireless power transmission apparatus 100 or 102 is higher than the transmission power of the wireless LAN, an RF component on the wireless LAN system is saturated if power is transmitted in an adjacent channel or the next adjacent channel of an operation channel of the wireless LAN system. Thus, for example, when the power transmission frequency band is initially set to the frequency hand on 5,732 MHz, the controller 18 illustrated in FIG. 1 or FIG. 2 monitors several communication channels in the vicinity of the power transmission frequency band such as a channel 144 (the power transmission frequency band corresponds to the adjacent channel for the wireless LAN) and a channel 140 (the power transmission frequency band corresponds to the next adjacent channel for the wireless LAN) in FIG. 5. The controller 18 determines whether there is a channel on which the wireless LAN is operating or a channel on which the wireless LAN can operate among these communication channels. The communication channel to be monitored is not limited to the adjacent communication channel in the power transmission frequency hand, and all communication channels included in a communication frequency band of the wireless LAN may be monitored.

If there is a channel on which the wireless LAN is operating or a channel on which the wireless LAN can operate in the vicinity of the power transmission frequency band, the power transmission frequency band may be changed to a frequency band which is away from 5,732 MHz and does not include the channel on which the wireless LAN is operating or the channel on which the wireless LAN can operate in the first embodiment. The power transmission frequency band may be hopped to a frequency band which is away from 5,732 MHz and does not include the channel on which the wireless LAN is operating or the channel on which the wireless LAN can operate in the second embodiment.

Alternatively, the controller 18 illustrated in FIG. 1 or 2 monitors the quality of some or all of channels in the frequency band shared by the wireless power transmission apparatus and the wireless LAN, and determines whether there is a channel having a better condition (for example, lower RSSI) than the channel including the reference frequency of 5,732 MHz. When there is the channel having the good condition, the power transmission frequency band may be changed from the channel on 5,732 MHz to the channel having the good condition in the first embodiment, and frequency hopping may be performed in the channel having the good condition in the second embodiment.

FIG. 19 is a flowchart illustrating an example of a process of controlling the power transmission according to the fifth embodiment. In Block 372, the controller 18 sets the power transmission frequency band to 5,732 MHz. The controller 18 monitors a communication state of neighboring channels of 5,732 MHz in Block 374. In Block 376, the controller 18 determines whether there is any channel on which the wireless LAN is operating or can operate. If the determination in Block 376 is No, the controller 18 transmits power in the power transmission frequency band on 5,732 MHz in Block 334.

If the determination in Block 376 is Yes, the controller 18 determines whether there is a channel having a good condition (for example, low RSSI) among channels of the frequency band shared by the wireless power transmission apparatus and the wireless LAN in Block 378. If the determination in Block 378 is No, the controller 18 transmits power in the power transmission frequency band on 5,732 MHz in Block 384.

If the determination in Block 378 is Yes, the controller 18 changes the power transmission frequency band to the channel having the good condition which is away from 5,732 MHz and does not include a channel on which the wireless LAN is operating or a channel on which the wireless LAN can operate in Block 382. Alternatively, when frequency hopping has been set, the controller 18 executes the frequency hopping of the power transmission frequency band in the channel having the good condition which is away from 5,732 MHz and does not include the channel on which the wireless LAN is operating or the channel on which the wireless LAN can operate in Block 382.

After setting the power transmission frequency band, the controller 18 transmits power using the set power transmission frequency band in Block 384. In Block 386, the controller 18 determines whether the power transmission has been completed. When the power transmission has been completed, the process is ended. When the power transmission has not been completed, the controller 18 performs the process of monitoring the channel of Block 374 again.

It is not always necessary to perform the two determinations of Block 376 and Block 378, and any one determination may be omitted.

Although the fifth embodiment has been described in combination with the first embodiment and/or the second embodiment, the power transmission time and transmission power at the time of one-time power transmission may be adjusted in combination with the third embodiment and/or the fourth embodiment.

A frequency band to which the power transmission frequency band selected in the above embodiments belongs will be described. For example, it is assumed that power transmission frequency band is included in W52, W53, and W56. It is conceivable that a frequency band covered by radio waves is restricted to about 5 GHz in wireless power transmission. In such a case, if the power transmission frequency band is selected from a frequency band having an upper limit of 5,732 MHz, a channel 48 closer to W53 of W52 becomes a lower limit band. In consideration of this, the power transmission frequency band may be selected according to the first embodiment or the second embodiment. In this example, for example, when the 2.4 GHz band is selected as the power transmission frequency band, the 5 GHz band is not used together, and the 2.4 GHz band is used alone.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a memory which stores communication channel information on at least one communication channel in a communication frequency band of a wireless communication standard;
   control circuitry which selects a first power transmission frequency channel based on the communication channel information; and
   a transmitter which transmits power via an electromagnetic wave in the first power transmission frequency channel,
   wherein:
   the first power transmission frequency channel is selectable from among a first frequency and a second frequency,
   the first frequency is between a frequency of a first data subcarrier and a frequency of a second data subcarrier,
   the first data subcarrier and the second data subcarrier are data subcarriers in a first communication channel,
   the data subcarriers are used for communication based on the wireless communication standard,
   the frequency of the first data subcarrier is higher than a frequency of a DC component of the at least one communication channel and closest to the frequency of the DC component,
   the frequency of the second data subcarrier is lower than the frequency of the DC component and closest to the frequency of the DC component,
   the second frequency is between a frequency of a third data subcarrier and a frequency of a fourth data subcarrier,
   the frequency of the third data subcarrier is higher than a frequency of a boundary between a second communication channel and a neighboring communication channel adjacent to the second communication channel and closest to the frequency of the boundary,
   the frequency of the fourth data subcarrier is lower than the frequency of the boundary and closest to the frequency of the boundary, and
   the second frequency does not include a frequency of a data subcarrier of communication channels used for communication based on the wireless communication standard.

2. The electronic apparatus according to claim 1, wherein:
   the frequency of the first data subcarrier and the frequency of the second data subcarrier are not in the first power transmission frequency channel, and
   the frequency of the third data subcarrier and the frequency of the fourth data subcarrier are not in the first power transmission frequency channel.

3. The electronic apparatus according to claim 1, wherein the first power transmission frequency channel comprises a center frequency of the at least one communication channel.

4. The electronic apparatus according to claim 1, wherein:
   the communication frequency band comprises a third communication channel having a first bandwidth and a fourth communication channel having a second bandwidth that is a power of two of the first bandwidth, and
   the control circuitry selects the first power transmission frequency channel based on the channel information.

5. The electronic apparatus according to claim 1, wherein a frequency of a pilot subcarrier of any communication channel is not in the first power transmission frequency channel.

6. The electronic apparatus according to claim 1, further comprising:
   a receiver which receives information relating to a power receiving state transmitted from a power receiving device,
   wherein a frequency of the information relating to the power receiving state comprises a fixed frequency.

7. The electronic apparatus according to claim 1, wherein:
   after the transmitter transmits the power via the electromagnetic wave in the first power transmission frequency channel, the control circuitry selects a second power transmission frequency channel different from the first power transmission frequency channel, and the transmitter transmits power via an electromagnetic wave in the second power transmission frequency channel,
   the at least one communication channel comprises first channels having a first bandwidth and second channels having a second bandwidth that is a power of two of the first bandwidth, and
   the first power transmission frequency channel and the second power transmission frequency channel are different from each other by at least the power of two of the first bandwidth.

8. The electronic apparatus according to claim 1, wherein:
   the control circuitry sequentially selects different power transmission frequency channels,
   the transmitter repeats transmission of the power in the different power transmission frequency channels,
   the at least one communication channel comprises first channels having a first bandwidth and second channels having a second bandwidth that is a power of two of the first bandwidth, and
   a power transmission frequency channel relating to one-time transmission and a power transmission frequency channel relating to previous transmission are different from each other by at least the power of two of the first bandwidth.

9. The electronic apparatus according to claim 1, wherein:
   when the control circuitry repeatedly selects the first power transmission frequency channel, the transmitter repeatedly transmits power of a first power level, and when the control circuitry sequentially selects different power transmission frequency channels, the transmitter repeatedly transmits power of a second power level which is higher than the first power level.

10. The electronic apparatus according to claim 9, wherein:
the at least one communication channel comprises first channels having a first bandwidth and second channels having a second bandwidth that is a power of two of the first bandwidth, and
a power transmission frequency channel relating to one-time transmission and a power transmission frequency channel relating to previous transmission are different from each other by at least the power of two of the first bandwidth.

11. The electronic apparatus according to claim 1, wherein a transmission time of the power by the transmitter is longer than a time corresponding to a maximum pulse length of radar defined by the wireless communication standard.

12. The electronic apparatus according to claim 1, wherein a transmission time of the power by the transmitter is shorter than a time corresponding to a shortest pulse length of a pulse detectable by the wireless communication standard.

13. The electronic apparatus according to claim 1, wherein a level of the power transmitted by the transmitter is inversely proportional to a power transmission time.

14. The electronic apparatus according to claim 1, wherein:
the control circuitry determines whether the at least one communication channel is used by the wireless communication standard when the transmitter transmits power via an electromagnetic wave in a power transmission frequency channel which is not in the communication frequency band and close to the communication frequency band, and
the control circuitry selects, as the first power transmission frequency channel, a communication channel other than the at least one communication channel that is used by the wireless communication standard when it is determined that the at least one communication channel is used by the wireless communication standard.

15. The electronic apparatus according to claim 1, wherein:
the control circuitry determines whether a reception state of the at least one communication channel is good when the transmitter transmits power via an electromagnetic wave in a power transmission frequency channel which is not in the communication frequency band and close to the communication frequency band, and
the control circuitry selects, as the first power transmission frequency channel, the at least one communication channel having a good reception state.

16. A wireless power transmission method comprising:
reading, from a memory, communication channel information on at least one communication channel in a communication frequency band of a wireless communication standard;
selecting a power transmission frequency channel based on the communication channel information; and
transmitting power via an electromagnetic wave in the power transmission frequency channel,
wherein:
the power transmission frequency channel is selectable from among a first frequency and a second frequency,
the first frequency is between a frequency of a first data subcarrier and a frequency of a second data subcarrier,
the first data subcarrier and the second data subcarrier are data subcarriers in a first communication channel,
the data subcarriers are used for communication based on the wireless communication standard,
the frequency of the first data subcarrier is higher than a frequency of a DC component of the at least one communication channel and closest to the frequency of the DC component,
the frequency of the second data subcarrier is lower than the frequency of the DC component and closest to the frequency of the DC component,
the second frequency is between a frequency of a third data subcarrier and a frequency of a fourth data subcarrier,
the frequency of the fourth data subcarrier is higher than a frequency of a boundary between a second communication channel and a neighboring communication channel adjacent to the second communication channel and closest to the frequency of the boundary,
the frequency of the fourth data subcarrier is lower than the frequency of the boundary and closest to the frequency of the boundary, and
the second frequency does not include a frequency of a data subcarrier of communication channels used for communication based on the wireless communication standard.

17. An electronic apparatus comprising:
a memory which stores communication channel information on at least one communication channel in a communication frequency band of a wireless communication standard within a power transmission region;
control circuitry which selects a power transmission frequency channel based on the communication channel information such that the power transmission frequency channel overlaps with the communication frequency band and an interference of the power transmission frequency channel to the at least one communication channel is reduced; and
a transmitter which transmits power within the power transmission region via an electromagnetic wave in the power transmission frequency channel,
wherein:
the power transmission frequency channel is selectable from among a first frequency and a second frequency,
the first frequency is between a frequency of a first data subcarrier and a frequency of a second data subcarrier,
the first data subcarrier and the second data subcarrier are data subcarriers in a first communication channel,
the data subcarriers are used for communication based on the wireless communication standard,
the frequency of the first data subcarrier is higher than a frequency of a DC component of the at least one communication channel and closest to the frequency of the DC component,
the frequency of the second data subcarrier is lower than the frequency of the DC component and closest to the frequency of the DC component,
the second frequency is between a frequency of a third data subcarrier and a frequency of a fourth data subcarrier,
the frequency of the third data subcarrier is higher than a frequency of a boundary between a second communication channel and a neighboring communication channel adjacent to the second communication channel and closest to the frequency of the boundary, the frequency of the fourth data subcarrier is lower than the frequency of the boundary and closest to the frequency of the boundary, and the second frequency does not include a frequency of a data subcarrier of communication channels used for communication based on the wireless communication standard.

* * * * *